US012588309B2

(12) United States Patent
Baba

(10) Patent No.: US 12,588,309 B2
(45) Date of Patent: Mar. 24, 2026

(54) SOLID-STATE IMAGING APPARATUS, METHOD FOR MANUFACTURING SOLID-STATE IMAGING APPARATUS, AND ELECTRONIC APPARATUS

(71) Applicant: SONY SEMICONDUCTOR SOLUTIONS CORPORATION, Kanagawa (JP)

(72) Inventor: Tomohiko Baba, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 393 days.

(21) Appl. No.: 18/005,094

(22) PCT Filed: Jun. 3, 2021

(86) PCT No.: PCT/JP2021/021231
§ 371 (c)(1),
(2) Date: Jan. 11, 2023

(87) PCT Pub. No.: WO2022/018981
PCT Pub. Date: Jan. 27, 2022

(65) Prior Publication Data
US 2023/0261018 A1      Aug. 17, 2023

(30) Foreign Application Priority Data

Jul. 21, 2020     (JP) ................................. 2020-124490

(51) Int. Cl.
*H10F 39/00*          (2025.01)
(52) U.S. Cl.
CPC ......... *H10F 39/806* (2025.01); *H10F 39/024* (2025.01); *H10F 39/802* (2025.01)

(58) Field of Classification Search
None
See application file for complete search history.

(56) References Cited

U.S. PATENT DOCUMENTS

2002/0005471 A1*    1/2002   Suzuki .................. H10F 39/806
                                                       257/E31.128
2007/0221826 A1*    9/2007   Bechtel .............. G02B 13/0085
                                                       250/208.1
(Continued)

FOREIGN PATENT DOCUMENTS

JP            4000507          10/2007
JP          2008-042796         2/2008
(Continued)

OTHER PUBLICATIONS

International Search Report and Written Opinion prepared by the Japan Patent Office on Aug. 11, 2021, for International Application No. PCT/JP2021/021231, 3 pgs.

*Primary Examiner* — Nilufa Rahim
(74) *Attorney, Agent, or Firm* — SHERIDAN ROSS P.C.

(57) ABSTRACT

There is provided a solid-state imaging apparatus that allows to suitably dispose a translucent member on a substrate including a photoelectric conversion portion. The solid-state imaging apparatus of the present disclosure has: a substrate that includes a photoelectric conversion portion; a lens that is disposed on the substrate; and a translucent member that is disposed on the lens. The translucent member includes a plurality of protruded portions that are disposed in a two-dimensional array form on an upper surface of the translucent member.

20 Claims, 31 Drawing Sheets

(56) References Cited

U.S. PATENT DOCUMENTS

| | | | |
|---|---|---|---|
| 2010/0328587 | A1 | 12/2010 | Yamada et al. |
| 2013/0032914 | A1 | 2/2013 | Iwasaki |
| 2017/0261738 | A1* | 9/2017 | Shiono ............... G02B 21/0056 |
| 2017/0363722 | A1 | 12/2017 | Yonehara et al. |

FOREIGN PATENT DOCUMENTS

| | | | |
|---|---|---|---|
| JP | 2010103490 | A | 5/2010 |
| JP | 2011-013330 | | 1/2011 |
| JP | 2011-180426 | | 9/2011 |
| JP | 2013-038164 | | 2/2013 |
| JP | 2017-224755 | | 12/2017 |
| KR | 20050016021 | A | 2/2005 |

* cited by examiner

SOLID-STATE IMAGING APPARATUS, METHOD FOR MANUFACTURING SOLID-STATE IMAGING APPARATUS, AND ELECTRONIC APPARATUS

CROSS REFERENCE TO RELATED APPLICATIONS

This application is a national stage application under 35 U.S.C. 371 and claims the benefit of PCT Application No. PCT/JP2021/021231, having an international filing date of 3 Jun. 2021, which designated the United States, which PCT application claimed the benefit of Japanese Patent Application No. 2020-124490, filed 21 Jul. 2020, the entire disclosures of each of which are incorporated herein by reference.

TECHNICAL FIELD

The present disclosure relates to a solid-state imaging apparatus, a method for manufacturing a solid-state imaging apparatus, and an electronic device.

BACKGROUND ART

In recent years, such solid-state imaging apparatuses as a CCD sensor and a CMOS sensor are installed not only in cameras but also in various other devices. For example, solid-state imaging apparatuses are installed in small-sized devices, and for this, thinner solid-state imaging apparatuses are demanded. A widely used method for this purpose is a packaging method called a "chip scale package (CSP)", which does not require wire bonding. In the case of using CSP, a translucent member, such as a cover glass, is attached on a substrate which includes a photodiode (photoelectric conversion portion).

CITATION LIST

Patent Literature

[PTL 1]
JP 4000507 B
[PTL 2]
JP 2013-38164 A

SUMMARY

Technical Problem

In the case of using CSP, however, reflection of light inside the glass cover becomes a problem. For example, there is a phenomenon in which the reflection diffraction inside the glass cover is reflected on an image, which negatively influences the image quality. If there is an attempt to control the diffraction reflection using a conventional method, the image may be blurred. Therefore in the case of using CSP, it is desirable to minimize these problems.

With the foregoing in view, it is an object of the present disclosure to provide a solid-state imaging apparatus, a method for manufacturing a solid-state imaging apparatus, and an electronic device that allow to suitably dispose a translucent member on a substrate which includes a photoelectric conversion portion.

Solution to Problem

A solid-state imaging apparatus according to a first aspect of the present disclosure includes: a substrate that includes a photoelectric conversion portion; a lens that is disposed on the substrate; and a translucent member that is disposed on the lens, wherein the translucent member includes a plurality of protruded portions that are disposed in a two-dimensional array form on an upper surface of the translucent member. Thereby the translucent member can be suitably disposed on the substrate which includes the photoelectric conversion portion. For example, using the protruded portions included in the translucent member, the negative influence of the reflection diffraction inside the translucent member on an image can be reduced.

In the first aspect, the height of the protruded portion may be 0.13 to 1.00 μm. Thereby the transmittance of the light from the translucent member to the outside on the upper surface of the translucent member can be improved, for example.

In the first aspect, a pitch of the protruded portions may be 0.23 to 0.70 μm. Thereby the ratio of the 0-order transmitted light in the transmitted light transmitting from the outside to the translucent member on the upper surface of the translucent member can be increased, for example.

In the first aspect, a packaging ratio of the protruded portions on the upper surface of the translucent member may be 35% or more. Thereby the transmittance of the light from the outside to the translucent member on the upper surface of the translucent member can be improved, for example.

In the first aspect, the packaging ratio of the protruded portions on the upper surface of the translucent member may be 60% or more. Thereby the transmittance of the light from the outside to the translucent member on the upper surface of the translucent member can be further improved, for example.

In the first aspect, the protruded portions may be disposed so that 97% or more of the transmitted light, of the light which entered the upper surface of the translucent member from a subject side at a 0° incident angle, becomes a non-diffracted light, and 30% or more of transmitted light, of the light which entered the upper surface of the translucent member from the substrate side at a 43° incident angle, becomes a non-diffracted light. Thereby a solid-state imaging apparatus having desirable camera characteristics can be implemented, for example.

In the first aspect, the shape of the protruded portion may be a cylinder, a prism, a cone or a pyramid. Thereby the protruded portions can be disposed in a two-dimensional array form, or the protruded portions can be easily formed, for example.

In the first aspect, the protruded portion includes a first portion, and a second portion that is disposed on the first portion and has a projection area larger than the first portion. Thereby the way of propagation of the light can be adjusted using these portions, for example.

In the first aspect, the protruded portion may include a first portion, and a second portion that is disposed on the first portion and has a projection area smaller than the first portion. Thereby the way of propagation of the light can be adjusted using these portions, for example.

In the first aspect, a shape of a vertical cross-section of the protruded portion may be a trapezoid. Therefore a protruded portion having an intermediate characteristic between a cylinder (or a prism) and a cone (or a pyramid) can be formed, for example.

In the first aspect, the protruded portion may include a recessed portion which extends in the vertical direction inside the protruded portion. Thereby the way of propagation of the light can be adjusted using the recessed portion, for example.

In the first aspect, a planar shape of the protruded portion may be a circle or a polygon. Thereby the protruded portions can be disposed in a two-dimensional array form, or the protruded portions can be easily formed, for example.

In the first aspect, the protruded portions may be formed on the upper surface of the translucent member in a triangular lattice form. Thereby the protruded portions can be disposed so that the distance between the protruded portions is short, for example.

In the first aspect, the protruded portions may be exposed to air. Thereby the way of propagation of the light which enters from the air or the light which is emitted into the air can be adjusted using the protruded portions, for example.

In the first aspect, the protruded portion may be formed of $SiO_2$, SiN, $Al_2O_3$, $HfO_2$, $TiO_2$ or STO (strontium titanium oxide (where Si is silicon, O is oxygen, N is nitrogen, Al is aluminum, Hf is hafnium and Ti is titanium)). Thereby the protruded portion can be formed using a material that is widely used in a semiconductor process, for example.

In the first aspect, the translucent member may be a glass cover. Thereby the negative influence of the reflection diffraction inside the glass cover on the image quality can be reduced, for example.

In the first aspect, the translucent member may be adhered to the substrate. Thereby the translucent member can be easily disposed on the substrate using an adhesive, for example.

A method for manufacturing a solid-state imaging apparatus according to a second aspect of the present disclosure includes steps of: disposing a translucent member on a substrate that includes a photoelectric conversion portion via a lens; and forming a plurality of protruded portions in a two-dimensional array form on an upper surface of the translucent member. Thereby the translucent member can be suitably disposed on the substrate which includes the photoelectric conversion portion. For example, using the protruded portions including in the translucent member, the negative influence of the reflection diffraction inside the translucent member on an image can be reduced.

In the second aspect, the protruded portions may be formed on the upper surface of the translucent member by processing the upper surface of the translucent member by etching. Thereby the protruded portions may be easily formed by etching, for example.

An electronic device according to a third aspect of the present disclosure includes: a substrate that includes a photoelectric conversion portion; a first lens that is disposed on the substrate; a translucent member that is disposed on the lens; and a second lens that is disposed above the translucent member so as to be separated from the translucent member, wherein the translucent member includes a plurality of protruded portions that are disposed in a two-dimensional array form on an upper surface of the translucent member. Thereby the translucent member can be suitably disposed on the substrate which includes the photoelectric conversion portion. For example, using the protruded portions included in the translucent member, the negative influence of the reflection diffraction inside the translucent member on the image can be reduced.

BRIEF DESCRIPTION OF DRAWINGS

FIG. 5 is another cross-sectional view depicting the structure of the solid-state imaging apparatus of Embodiment 1.

FIGS. 6A-6C indicate plan views depicting a structure of the solid-state imaging apparatus of Embodiment 1, before and after dicing.

DESCRIPTION OF EMBODIMENTS

Embodiments of the present disclosure will be described with reference to the drawings.

Embodiment 1

Figure 1:
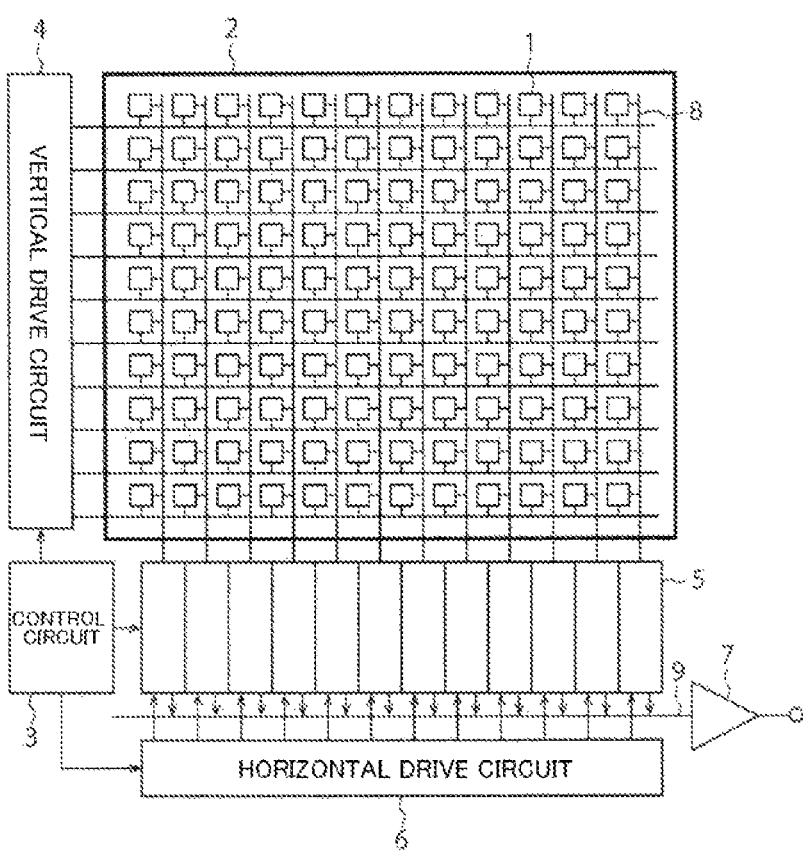
FIG. 1 is a block diagram depicting a configuration of a solid-state imaging apparatus of Embodiment 1.

FIG. 1 is a block diagram depicting a configuration of a solid-state imaging apparatus according to Embodiment 1.

The solid-state imaging apparatus in FIG. 1 is a complementary metal oxide semiconductor (CMOS) type image sensor, and includes a pixel array region 2 having a plurality of pixels 1, a control circuit 3, a vertical drive circuit 4, a plurality of column signal processing circuits 5, a horizontal drive circuit 6, an output circuit 7, and a plurality of vertical signal lines 8 and a horizontal signal line 9.

Each pixel 1 includes a photodiode that functions as a photoelectric conversion portion, and a plurality of pixel transistors. Examples of the pixel transistor are such MOS transistors as a transfer transistor, a reset transistor, an amplification transistor and a selection transistor.

The pixel array region 2 has a plurality of pixels 1 which are disposed in a two-dimensional array form. The pixel array region 2 includes: an effective pixel region that receives light and performs photoelectric conversion, and amplifies signal charges generated by the photoelectric conversion and outputs the amplified signal charges; and a black reference pixel region that outputs an optical black to be the reference of the black level. Normally the black reference pixel region is disposed on an outer periphery area of the effective pixel region.

The control circuit 3 generates various signals to be the reference of operation of the vertical drive circuit 4, the column signal processing circuit 5 and the horizontal drive circuit 6, based on a vertical synchronization signal, a horizontal synchronization signal, a master clock and the like. The signals generated by the control circuit 3 are a clock signal and a control signal, for example, and are inputted to the vertical drive circuit 4, the column signal processing circuits 5, the horizontal drive circuit 6 and the like.

The vertical drive circuit 4 includes a shift register, for example, in which each pixel 1 in the pixel array region 2 is vertically scanned in row units. The vertical drive circuit 4 also supplies a pixel signal, based on the signal charge generated by each pixel 1, to the column signal processing circuits 5 via the vertical signal lines 8.

The column signal processing circuit 5 is disposed for each column of the pixels 1 in the pixel array region 2, for example, and performs signal processing of signals outputted from one row of pixels 1 based on the signal from the black reference pixel region. Examples of the signal processing are noise elimination and signal amplification.

The horizontal drive circuit 6 includes a shift register, for example, and supplies a pixel signal from each column signal processing circuit 5 to the horizontal signal line 9.

The output circuit 7 performs signal processing on a signal supplied from each column signal processing circuit 5 via the horizontal signal line 9, and outputs the signal generated by this signal processing.

Figures 2A, 2B, 2C:
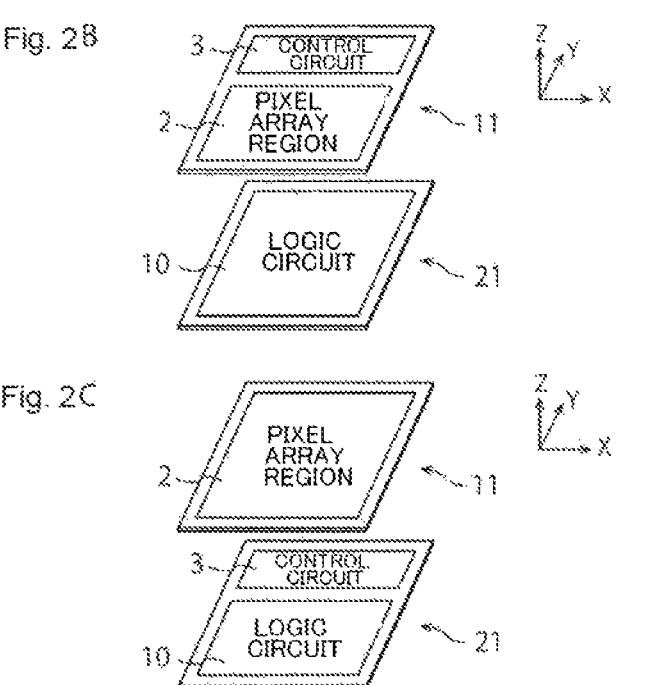
FIGS. 2A-2C indicate perspective views depicting examples of a structure of the solid-state imaging apparatus of Embodiment 1.

FIGS. 2A-2C indicate perspective views depicting examples of the structure of the solid-state imaging apparatus according to Embodiment 1.

In FIGS. 2A to 2C, the X axis, Y axis and Z axis, which are vertical to each other, are indicated. The X direction and the Y direction correspond to the lateral directions (horizontal directions), and the Z direction corresponds to the longitudinal direction (vertical direction). The +Z direction corresponds to the up direction, and the −Z direction corresponds to the down direction. The −Z direction may exactly match with the gravity direction, or may not exactly match with the gravity direction.

In the first example indicated in FIG. 2A, the solid-state imaging apparatus includes the pixel array region 2, the control circuit 3 and a logic circuit 10 on a substrate 11. The logic circuit 10 includes the vertical drive circuit 4, the column signal processing circuits 5, the horizontal drive circuit 6 and the output circuit 7, which are mentioned above.

In the second example indicated in FIG. 2B, the solid-state imaging apparatus has the substrate 11 on a support substrate 21, where the pixel array region 2 and the control circuit 3 are on the substrate 11 and the logic circuit 10 is on the support substrate 21.

In the third example indicated in FIG. 2C, the solid-state imaging apparatus has the substrate 11 on the support substrate 21, where the pixel array region 2 is on the substrate 11 and the control circuit 3 and the logic circuit 10 are on the support substrate 21.

In the following description, it is assumed that the solid-state imaging apparatus of Embodiment 1 has the structure of the third example. The following description, however, is also applicable to the solid-state imaging apparatus having the structure of the first example or the second example, except for the description on the structure that is unique to the third example.

Figure 3:
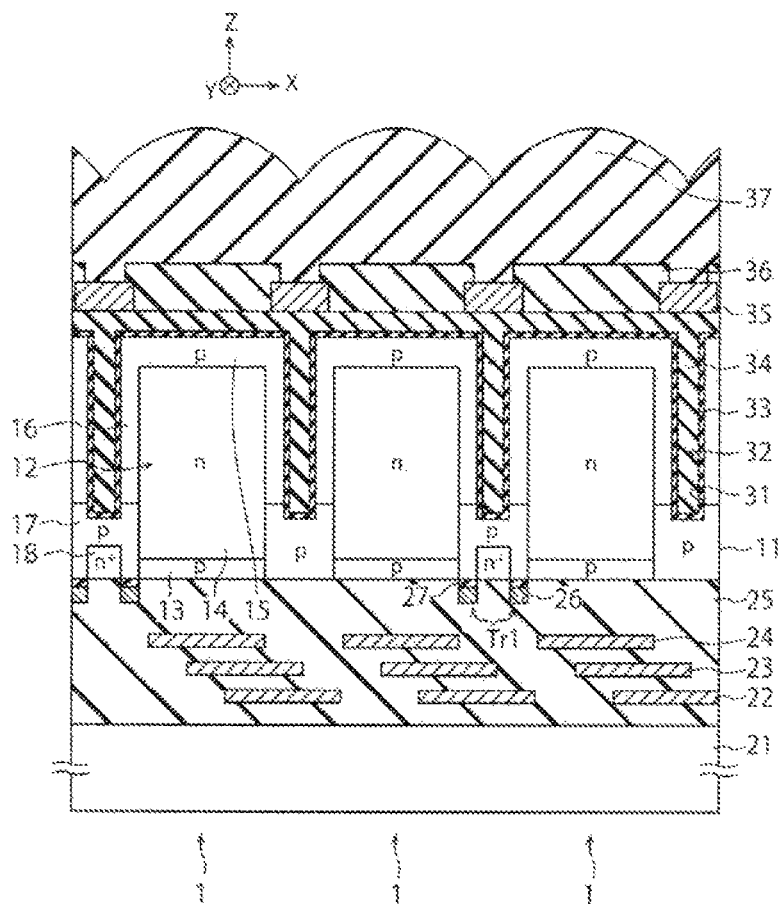
FIG. 3 is a cross-sectional view depicting a structure of the solid-state imaging apparatus of Embodiment 1.

FIG. 3 is a cross-sectional view depicting a structure of the solid-state imaging apparatus of Embodiment 1. FIG. 3 indicates a longitudinal cross-section of the pixel array region 2.

The solid-state imaging apparatus of Embodiment 1 includes: the substrate 11; a plurality of photoelectric conversion portions 12 inside the substrate 11; a p-type semiconductor region 13, an n-type semiconductor region 14 and a p-type semiconductor region 15 included in each photoelectric conversion portion 12; and a pixel isolation layer 16, a p-well layer 17 and a plurality of floating diffusion portions 18 inside the substrate 11.

The solid-state imaging apparatus of Embodiment 1 further includes: the support substrate 21; a plurality of wiring layers 22, 23 and 24; an interlayer insulation film 25; and a gate electrode 26 and a gate insulation film 27 included in each transfer transistor Tr1.

The solid-state imaging apparatus of Embodiment 1 further includes: a groove 31; an element isolation portion 32 disposed in the groove 31; a fixed charge film 33 (film having negative fixed charges) and an insulation film 34 included in the element isolation portion 32; a shielding film 35; a plurality of color filters 36; and a plurality of on-chip lenses 37.

The substrate 11 is such a semiconductor substrate as a silicon substrate, for example. In FIG. 3, the surface of the substrate 11 in the −Z direction is a front surface of the substrate 11, and the surface of the substrate 11 in the +Z direction is a rear surface of the substrate 11. The solid-state imaging apparatus of Embodiment 1 is a rear face irradiation type, hence the rear surface of the substrate 11 becomes a light incidence surface (light-receiving surface) of the substrate 11.

The photoelectric conversion portion 12 is disposed for each pixel 1 inside the substrate 11. FIG. 3 illustrates three photoelectric conversion portions 12 disposed for three pixels 1 as an example. Each photoelectric conversion portion 12 includes the p-type semiconductor region 13, the n-type semiconductor region 14 and the p-type semiconductor region 15, which are sequentially formed inside the substrate 11 from the front surface side to the rear surface side of the substrate 11. In the photoelectric conversion portion 12, main photodiodes are implemented by a p-n junction of the p-type semiconductor region 13 and the n-type semiconductor region 14, and a p-n junction of the n-type semiconductor region 14 and the p-type semiconductor region 15, and the photodiodes convert light into electric charges. The photoelectric conversion portion 12 receives light from the rear surface side of the substrate 11, generates signal charges corresponding to the quantity of received light, and stores the generated signal charges in the n-type semiconductor region 14.

The pixel isolation layer 16 is a p-type semiconductor region disposed between adjacent photoelectric conversion portions 12. The p-well layer 17 is a p-type semiconductor region that is disposed on the front surface side of the substrate 11 with respect to the pixel isolation layer 16. The floating diffusion portion 18 is an n+-type semiconductor region that is disposed on the front surface side of the substrate 11 with respect to the p-well layer 17. The floating diffusion portion 18 is formed by injecting n-type impurities into the p-well layer 17 at high concentration, for example.

The groove 31 has a shape that extends from the rear surface of the substrate 11 in the depth direction (−Z direction), and is disposed between the adjacent photoelectric conversion portions 12, just like the pixel isolation layer 16. The groove 31 is formed by forming a recessed portion in the pixel isolation layer 16 from the rear surface of the substrate 11 by etching. The groove 31 of Embodiment 1 reaches the p-well layer 17, but does not reach the floating diffusion portion 18.

The element isolation portion 32 includes the fixed charge film 33 and the insulation film 34 which are sequentially formed in the groove 31. The fixed charge film 33 is formed on the side face and the bottom face of the groove 31. The insulation film 34 is formed in the groove 31 via the fixed charge film 33.

The fixed charge film 33 is a film having negative fixed charges, and constitutes the element isolation portion 32, along with the insulation film 34. The fixed charge film 33 has a function to reduce the generation of noise called "dark current", caused by minute defects that exist on the interface of the substrate 11. The fixed charge film 33 is an oxide film or a nitride film containing such metallic elements as hafnium (Hf), aluminum (Al), zirconium (Zr), tantalum (Ta) or titanium (Ti), for example. The fixed charge film 33 of Embodiment 1 is formed on the entire rear surface of the substrate 11, and is disposed not only inside the element isolation portion 32 but also above the photoelectric conversion portion 12.

The insulation film 34, along with the fixed charge film 33, constitutes the element isolation portion 32. In Embodiment 1, the photoelectric conversion portions 12 are isolated from each other by the fixed charge film 33 and the insulation film 34 by embedding the fixed charge film 33 and the insulation film 34 inside the groove 31. Thereby the mixing of colors of pixels 1 can be reduced. The insulation film 34 is a silicon oxide film, silicon nitride film, silicon oxynitride film, or a resin film, for example. The insulation film 34 of Embodiment 1 is formed on the entire rear surface of the substrate 11, and is disposed not only inside the element isolation portion 32, but also above the photoelectric conversion portion 12.

The shielding film 35 is a film that has a function to shield light, and is formed on a predetermined region of the insulation film 34 which is formed on the rear surface of the substrate 11. The shielding film 35 of Embodiment 1 is formed above the element isolation portion 32, and has a meshed planar shape. The light that entered the shielding film 35 is shielded by the shielding film 35 or passes through the openings (mesh) of the shielding film 35.

The shielding film 35 is a film containing a metallic element, such as tungsten (W), aluminum (Al) or copper (Cu), for example.

The color filter 36 has a function to transmit light having a predetermined wavelength, and is formed for each pixel 1 on the insulation film 34 and the shielding film 35. For example, the color filters 36 for red (R), green (G) and blue (B) are disposed above the photoelectric conversion portions 12, for the pixels 1 of red, green and blue respectively. Further, the color filter 36 for infrared light may be disposed above the photoelectric conversion portion 12 for the pixels 1 of infrared light. The light transmitted through each color filter 36 enters the photoelectric conversion portion 12 via the insulation film 34 and the fixed charge film 33.

The on-chip lens 37 has a function to collect entered light, and is formed for each pixel 1 on the color filter 36. The light collected by each on-chip lens 37 enters the photoelectric conversion portion 12 via the color filter 36, the insulation film 34 and the fixed charge film 33. Each on-chip lens 37 of Embodiment 1 is formed of a material that transmits light, and the on-chip lenses 37 of Embodiment 1 are connected with each other via this material. The on-chip lens 37 is an example of the lens or the first lens of the present disclosure.

The support substrate 21 is disposed on the front surface of the substrate 11 via the interlayer insulation film 25, and is disposed to ensure strength of the substrate 11. The support substrate 21 is such a semiconductor substrate as a silicon substrate, for example.

The wiring layers 22 to 24 are disposed inside the interlayer insulation film 25 on the front surface side of the substrate 11, and form a multilayer wiring structure. The multilayer wiring structure of Embodiment 1 includes three layers of the wiring layers 22 to 24, but may include four or more layers of the wiring layers. Each wiring layer 22 to 24 includes various wires, and the pixel transistors, such as the transfer transistors Tr1, are driven using these wires. The wiring layers 22 to 24 are layers containing such a metallic element as tungsten (W), aluminum (Al) or copper (Cu). The interlayer insulation film 25 is an insulation film including a silicon oxide film.

The gate electrode 26 of each transfer transistor Tr1 is disposed under the p-well layer 17 between the p-type semiconductor region 13 and the floating diffusion portion 18 via the gate insulation film 27. The gate electrode 26 and the gate insulation film 27 are disposed inside the interlayer insulation film 25. Each transfer transistor Tr1 can transfer the signal charges inside the photoelectric conversion portion 12 to the floating diffusion portion 18.

In Embodiment 1, the light which entered each on-chip lens 37 is collected by the on-chip lens 37, transmits through the color filter 36, passes through the opening of the shielding film 35, and enters the photoelectric conversion portion 12. The photoelectric conversion portion 12 converts this light into electric charges by performing photoelectric conversion, and generates signal charges. The signal charges are outputted as pixel signals via the vertical signal line 8 in the wiring layers 22 to 24.

Figure 4:
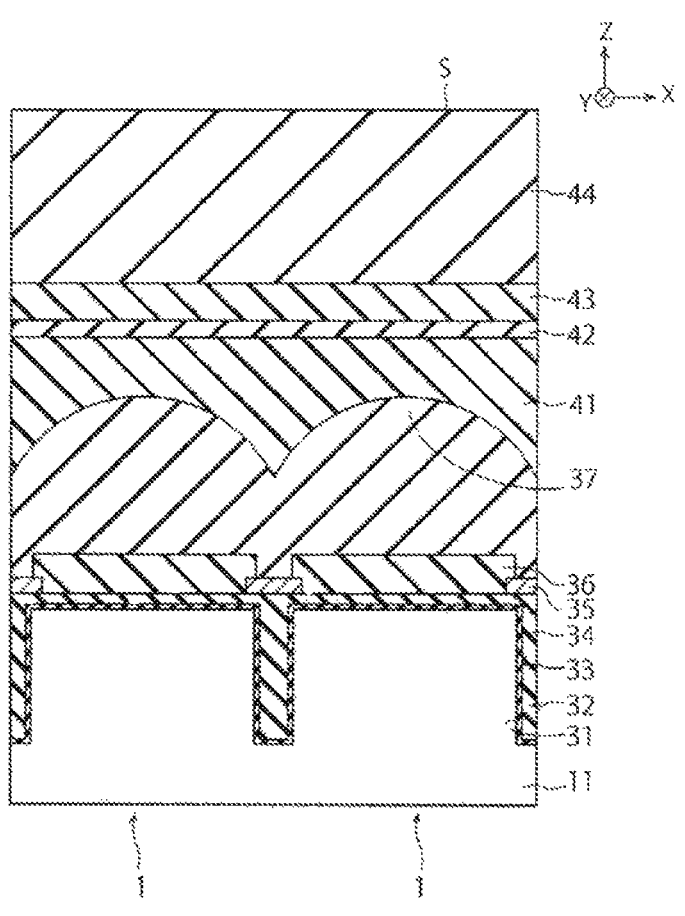
FIG. 4 is another cross-sectional view depicting the structure of the solid-state imaging apparatus of Embodiment 1.

FIG. 4 is another cross-sectional view depicting the structure of the solid-state imaging apparatus of Embodiment 1. FIG. 4 indicates an enlarged view of the longitudinal cross-section of the pixel array region 2. In FIG. 4, however, illustration of the photoelectric conversion portion 12 inside the substrate 11, the support substrate 21 under the substrate 11, and the like, are omitted.

The solid-state imaging apparatus of Embodiment 1 also includes a flattening film 41, a cover film 42, a glass seal resin 43 and a glass cover 44, in addition to the composing elements indicated in FIG. 3.

The flattening film 41 is formed on the rear surface of the substrate 11, so as to cover the plurality of on-chip lenses 37. Thereby the plane on the rear surface of the substrate 11 is flattened. The flattening film 41 is formed of a material of which refractive index is lower than the refractive index of the material of the on-chip lens 37. For example, the material of the on-chip lens 37 is silicon oxide, and the material of the flattening film 41 is resin.

The cover film 42, the glass seal resin 43 and the glass cover 44 are sequentially disposed on the flattening film 41. The glass cover 44 of Embodiment 1 is formed of glass (silicon oxide), and adhered to the cover film 42 by the glass seal resin 43. The glass cover 44 is an example of the translucent member of the present disclosure.

The glass cover 44 may be replaced with a different cover formed of a material through which light transmits (translucent material). This cover may be formed only of a translucent material other than glass, or may be formed of glass and a translucent material other than glass. This cover is also an example of the translucent member of the present disclosure.

FIG. 4 indicates an upper surface S of the glass cover 44. The upper surface S of the glass cover 44 of Embodiment 1 is exposed to the air. The glass cover 44 of Embodiment 1 includes a plurality of protruded portions 44b disposed on the upper surface S of the glass cover 44, as described later (see FIGS. 8B, 8C and the like), but in FIG. 4 and the like, illustration of the protruded portions 44b is omitted.

Figure 5:
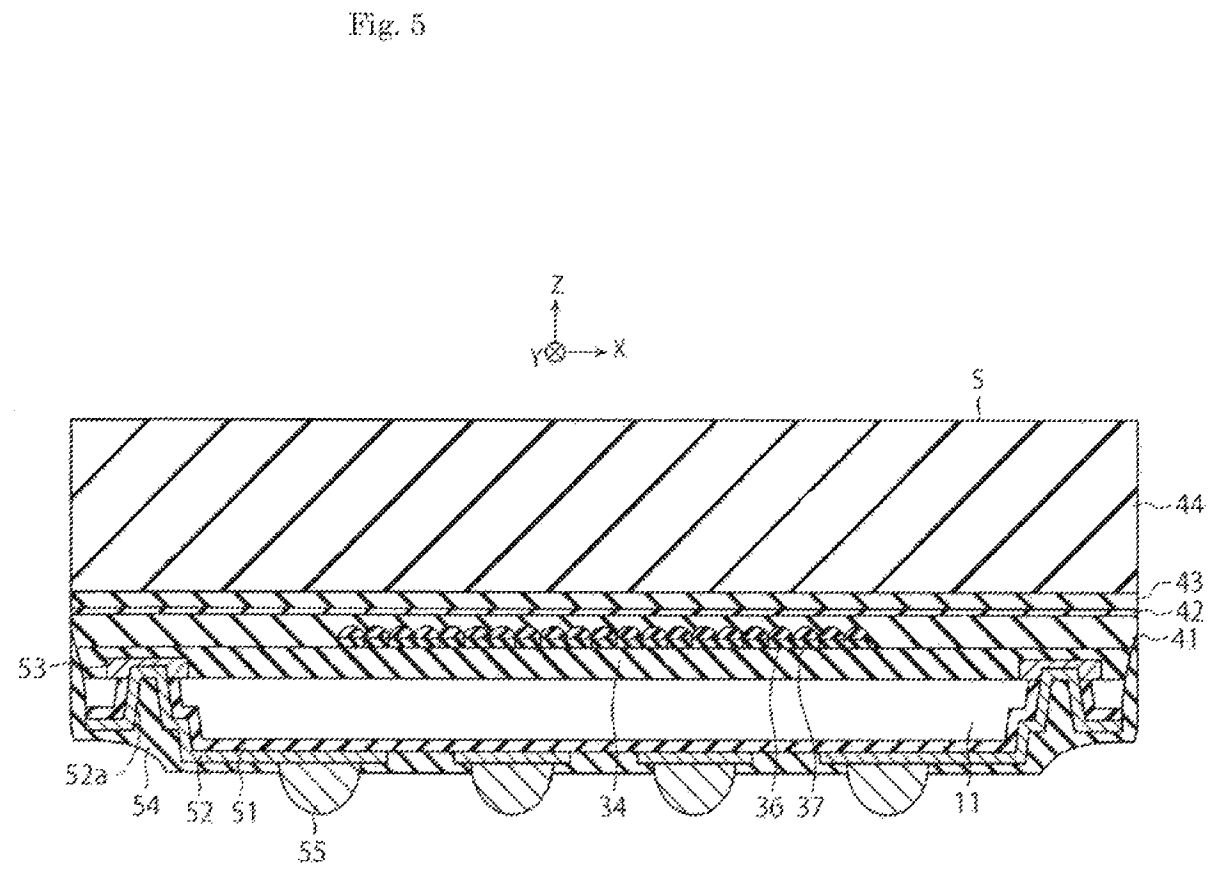

FIG. 5 is another cross-sectional view depicting the structure of the solid-state imaging apparatus of Embodiment 1. FIG. 5 indicates a longitudinal cross-section of the substrate 11 and the glass cover 44 as a whole. In FIG. 5, however, illustration of the photoelectric conversion portions 12 in the substrate 11, the support substrate 21 under the substrate 11, the fixed charge film 33 on the substrate 11, and the like, are omitted.

The solid-state imaging apparatus of Embodiment 1 also includes an insulation film 51, a wiring layer 52, a plurality of metal pads 53, a solder mask 54, and a plurality of solder balls 55, in addition to the composing elements indicated in FIGS. 3 and 4.

FIG. 5 indicates the flattening film 41 that is formed on the substrate 11, which is diced into chip sizes, so as to cover the plurality of on-chip lenses 37, the cover film 42, the glass seal resin 43, and the glass cover 44. As indicated in FIG. 5, the solid-state imaging apparatus of Embodiment 1 is packaged by a chip scale package (CSP). Therefore the size of the upper surface S of the glass cover 44 is approximately the same as the size of the upper surface (rear surface) of the substrate 11.

The insulation film 51 and the wiring layer 52 are sequentially disposed on the lower surface (front surface) of the substrate 11. The metal pads 53, on the other hand, are disposed on the upper surface of the substrate 11. The wiring layer 52 includes a plurality of vias 52a that penetrate the substrate 11, and the vias 52a contact the lower surface of the metal pad 53.

Thereby various devices on the upper surface of the substrate 11 and the wiring layer 52 can be electrically connected.

The solder mask 54 is disposed on the lower surface of the wiring layer 52. The solder balls 55 are disposed on the lower surface of the wiring layer 52, exposed from the solder mask 54. Thereby the solid-state imaging apparatus of Embodiment 1 and another apparatus can be electrically connected via the solder balls 55.

Figures 6A, 6B, 6C:
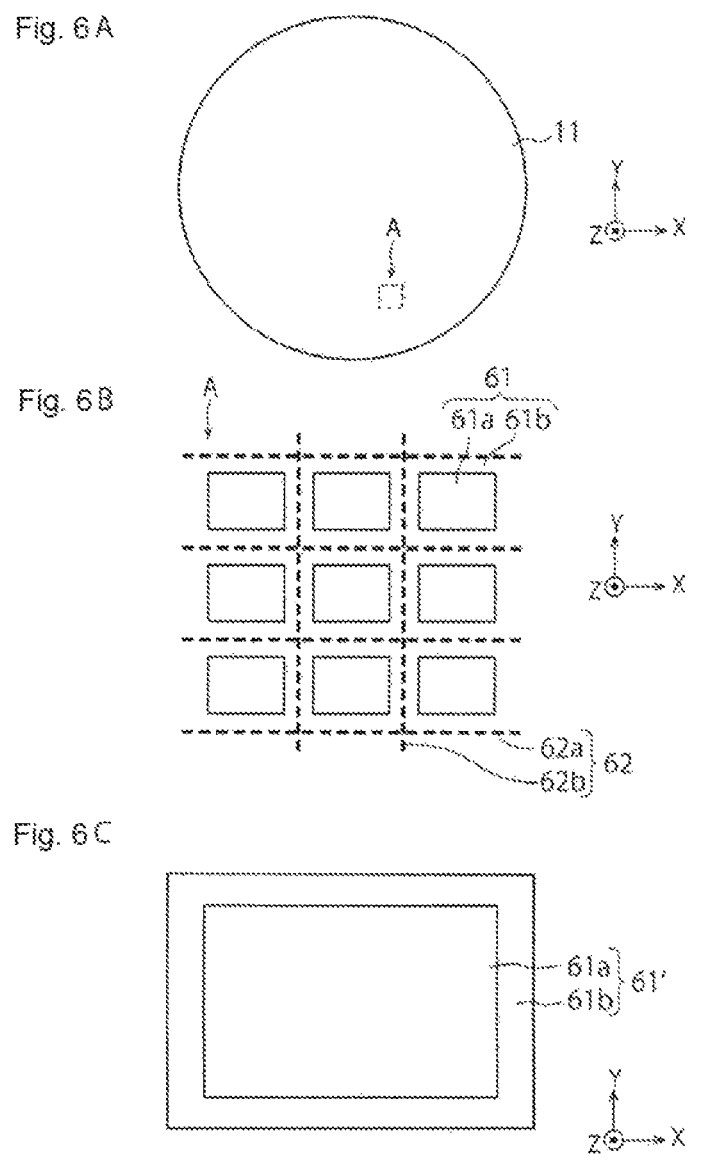

FIGS. 6A-6C indicate plan views depicting the structure of the solid-state imaging apparatus of Embodiment 1 before and after dicing.

FIG. 6A indicates a substrate (wafer) 11 before dicing. The substrate 11 is disposed on the support substrate 21 (see FIG. 3), which is not illustrated here, and is diced along with the support substrate 21.

FIG. 6B is an enlarged view of a region A indicated in FIG. 6A. The substrate 11 (and the support substrate 21) include a plurality of chip regions 61 and a dicing region 62. FIG. 6B indicates nine chip regions 61, for example. Each chip region 61 includes an effective pixel region 61a and an outer peripheral region 61b that surrounds the effective pixel region 61a. The dicing region 62 has a shape of combining a plurality of dicing lines 62a extending in the X direction and a plurality of dicing lines 62b extending in the Y direction. The substrate 11 is diced into a plurality of chips 61' (see FIG. 6C) by cutting these dicing lines 62a and 62b using a blade.

FIG. 6C indicates one chip 61' acquired by this dicing. The chip 61' includes the above mentioned effective pixel region 61a and the outer peripheral region 61b, and corresponds to the solid-state imaging apparatus indicated in FIG. 3.

Figure 7A:
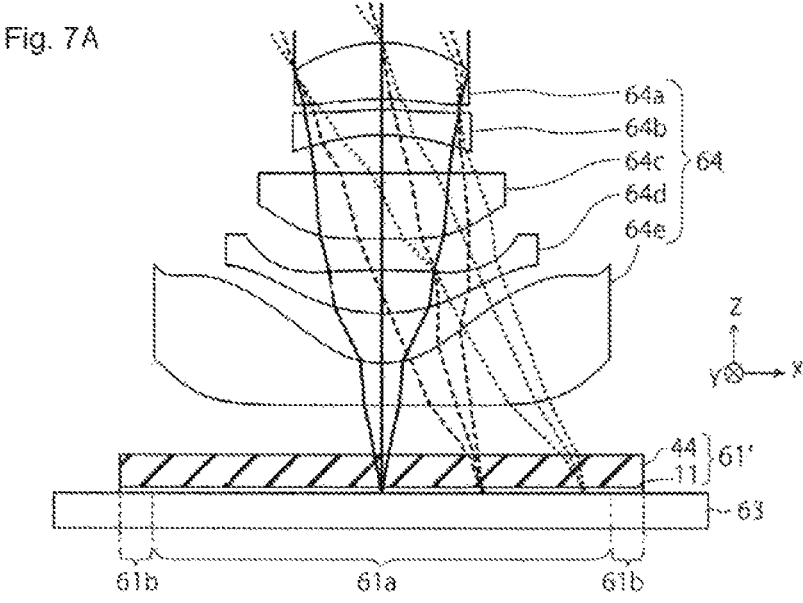
FIGS. 7A-7B indicate cross-sectional views depicting a state of propagation of light inside an electronic device of Embodiment 1, and a state of propagation of light inside an electronic device of a comparative example of Embodiment 1.
Figure 7B:
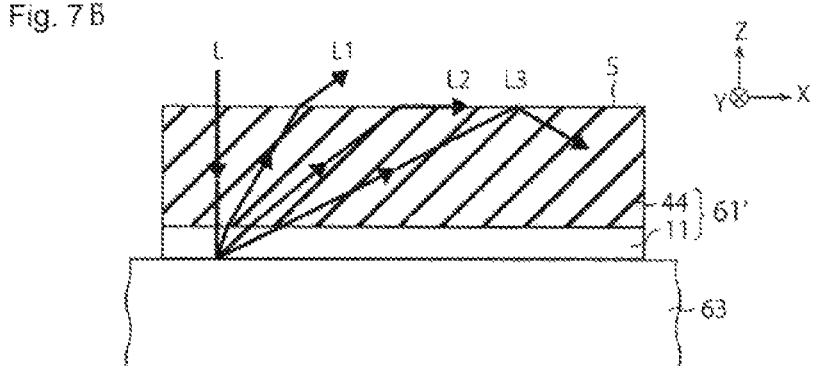

FIGS. 7A-7B indicate cross-sectional views depicting a state of propagation of light inside an electronic device of Embodiment 1, and a state of propagation of light inside an electronic device of a comparative example of Embodiment 1.

FIG. 7A indicates a longitudinal cross-section of the electronic device of Embodiment 1. The electronic device of Embodiment 1 includes the chip (solid-state imaging apparatus) 61', a mounting substrate 63, and an imaging lens assembly 64 constituted of a plurality of imaging lenses 64a to 64e. Examples of the electronic device of Embodiment 1 are: a camera (e.g. a digital video camera, a digital still camera, an action camera, an onboard camera), a portable telephone (e.g. smartphone), a computer (e.g. personal computer (PC)), and various IoT (Internet of Things) devices.

The chip 61' is stacked on the mounting substrate 63 via solder balls 55 (see FIG. 5), which are not illustrated here. Thereby the wiring of the chip 61' and the wiring of the mounting substrate 63 can be electrically connected via the solder balls 55. FIG. 7A indicates the substrate 11 and the glass cover 44 included in the chip 61'.

The imaging lenses 64a to 64e are disposed above the glass cover 44 so as to be separated from the glass cover 44. In the electronic device of Embodiment 1, the light from the subject sequentially transmits through the imaging lenses 64a to 64e, and enters the glass cover 44. The light which entered the glass cover 44 transmits through the glass cover 44, the on-chip lens 37, the color filter 36, and the like, and enters the photoelectric conversion portion 12 inside the substrate 11 (see FIG. 3). The imaging lenses 64a to 64e are examples of the second lens of the present disclosure.

FIG. 7A indicates a state of the light propagating from the imaging lenses 64a to 64e to the substrate 11. FIG. 7A indicates rays that enter the center portion of the chip 61', rays that enter an outer peripheral portion of the chip 61', and rays that enter between the center portion and the outer peripheral portion of the chip 61'.

Problems of the electronic device of the comparative example of Embodiment 1 will be described next with reference to FIG. 7B. FIG. 7B indicates a longitudinal cross-section of the electronic device of the comparative example. The electronic device of the comparative example has the same composing elements as the electronic device of Embodiment 1, and the glass cover 44 of the comparative example includes a flat upper surface S.

In the comparative example, a reflection diffraction flare is generated in the solid-state imaging apparatus as the sensitivity of the solid-state imaging apparatus increases, and image quality if negatively influenced thereby. The reflection diffraction flare is generated, for example, when the brightness of the light that enters the center portion of the solid-state imaging apparatus (center portion of the chip 61') is high. The solid-state imaging apparatus of this comparative example has a thin plate shape, hence the reflection diffraction tends to occur inside the solid-state imaging apparatus.

FIG. 7B indicates the incident light L that enters the substrate 11, and the reflected lights L1, L2 and L3 reflected inside the substrate 11 as an example. As indicated in FIG. 7B, the incident light L that entered the substrate 11 causes reflection diffraction, and becomes diffracted light (reflected light). The diffracted light indicated in FIG. 7B corresponds to a third order diffracted light. A part of the diffracted light re-enters the substrate 11, as indicated as the reflected light L3.

Here in the case where the incident light L enters the outer peripheral portion of the solid-state imaging apparatus, the reflected light L3 re-enters mostly not into the effective pixel region 61a, but into the outer peripheral region 61b, hence negative influence on the image quality caused thereby does not become a significant problem. In the case of the incident light L that enters the center portion of the solid-state imaging apparatus, however, the reflected light L3 re-enters mostly into the effective pixel region 61a, and the negative influence on the image quality caused thereby tends to become a problem.

In a case where the glass cover 44 of this comparative example is formed of a common glass, the total reflection condition of the glass cover 44 is about 43°. The total reflection condition is a minimum value of an incident angle at which the reflection of the light becomes 100% when the light enters from a medium having a higher refractive index to a medium having a lower refractive index. Since the upper surface S of the glass cover 44 of this comparative example is exposed to the air, the medium having a higher refractive index here is glass, and the medium having a lower refractive index here is the air. The incident angles of the reflected lights L1, L2 and L3, with respect to the upper surface S of the glass cover 44, are an angle smaller than 43°, 43°, and an angle larger than 43° respectively.

Therefore the diffracted light, of which incident angle between the glass cover 44 and the air is 43° or more, is totally reflected, and the diffracted light, of which incident angle is less than 43°, is released to the air. The intensity of the diffracted light observed above the glass cover 44 changes significantly at the boundary of total reflection. For example, the intensity of the diffracted light on one side of the total reflection boundary is approximately 10 times the intensity of the diffracted light on the other side of the total reflection boundary. This total reflection boundary becomes a cause of a ring-shaped flare. It is desirable to reduce the generation of such a flare.

Figure 8:
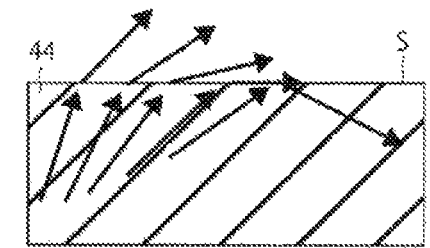
FIGS. 8A-8C indicate cross-sectional views depicting a state of propagation of light inside the solid-state imaging apparatus of the comparative example of Embodiment 1, and a state of propagation of light inside the solid-state imaging apparatus of Embodiment 1.
Figure 8:
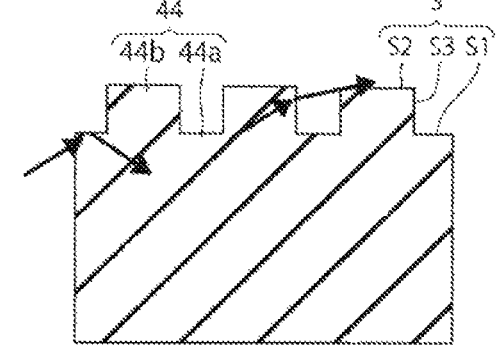
Figure 8:
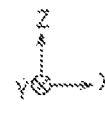
Figure 8:
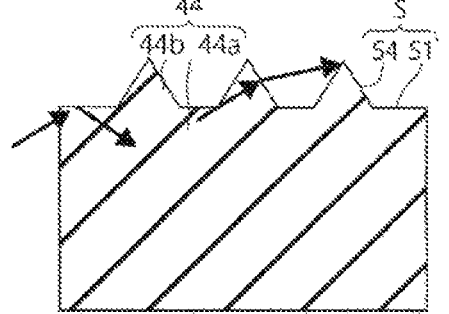
Figure 8:
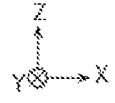

FIGS. 8A-8C indicate cross-sectional views depicting a state of propagation of light inside the solid-state imaging apparatus of the comparative example of Embodiment 1, and a state of propagation of light inside the solid-state imaging apparatus of Embodiment 1.

FIG. 8A indicates a longitudinal cross-section of the glass cover 44 of the comparative example of Embodiment 1. As mentioned above, on the upper surface S of the glass cover 44 of this comparative example, the total reflection light that enters the upper surface S from the glass cover 44 is totally reflected.

FIG. 8B indicates a longitudinal cross-section of the glass cover 44 of Embodiment 1. The glass cover 44 of Embodiment 1 has a plurality of protruded portions 44b disposed in a two-dimensional array form, on the upper surface S of the glass cover 44. Specifically, the glass cover 44 of Embodiment 1 includes a main unit portion 44a and these protruded portions 44b, and these protruded portions 44b protrude from the main unit portion 44a in the +Z direction. The main unit portion 44a and these protruded portions 44b of Embodiment 1 are formed of a same glass. The shape of each protruded portion 44b in Embodiment 1 is a cylinder.

The upper surface S of the glass cover 44 of Embodiment 1 includes an upper surface 51 of the main unit portion 44a and an upper surface S2 of each protruded portion 44b. The upper surface 51 of the main unit portion 44a and the upper surface S2 of each protruded portion 44b are connected by a side surface S3 of the protruded portion 44b. In a wider sense, the side surface S3 is also a part of the upper surface S. The protruded portions 44b are formed on the upper surface S of the glass cover 44 by processing the upper surface S of the glass cover 44 by etching, for example. The upper surface 51 corresponds to the upper surface processed by the etching, and the upper surface S2 corresponds to the upper surface not processed by the etching.

As described above, the upper surface S of the glass cover 44 of Embodiment 1 is not a simple plane, but is an embossed surface where fine irregularities are formed by the protruded portions 44b. Therefore even if light enters the upper surface S from the glass cover 44 at an angle at which total reflection would occur if the upper surface S were a simple plane, total reflection may not occur depending on the incident position of the light due to the influence of the irregularities. For example, FIG. 8B indicates a state where the light that entered the side surface S3 of the protruded portion 44b is released to the air. Thereby the occurrence of total reflection can be reduced, and the generation of a flare can be reduced.

FIG. 8C indicates the longitudinal cross-section of the glass cover 44 of a modification of Embodiment 1. The glass cover 44 of this modification also has a plurality of protruded portion 44b formed in a two-dimensional array form, on the upper surface S of the glass cover 44. The shape of each protruded portion 44b of this modification, however, is a cone. In other words, the shape of each protruded portion 44b may be a shape other than a cylinder. The other examples of the shape of each protruded portion 44b will be described later.

The upper surface S of the glass cover 44 of this modification includes the upper surface 51 of the main unit portion 44a and an upper surface S4 of each protruded portion 44b. The upper surface 51 of the main unit portion 44a and the upper surface S4 of each protruded portion 44b are directly connected. In this modification, the upper surface 51 is a horizontal surface that is parallel with the XY plane, and the upper surface S4 is an inclined plane that is inclined from the XY plane.

FIG. 8C indicates a state where light that entered the upper surface S4 of the protruded portion 44b is released to the air. Thereby the occurrence of total reflection can be reduced, and the generation of a flare can be reduced.

Figure 9A:
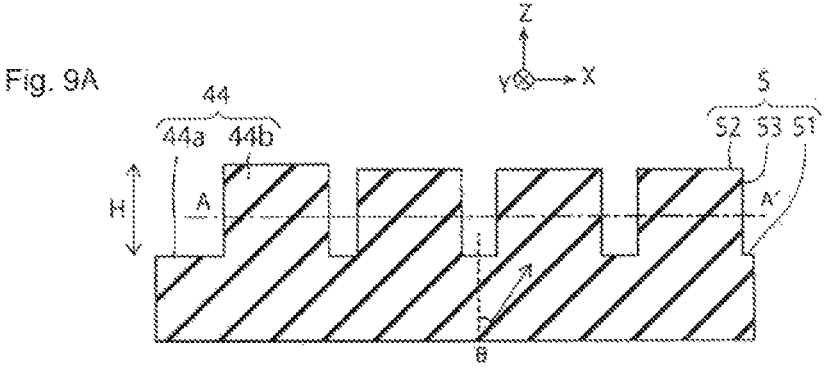
FIGS. 9A-9B indicate cross-sectional views depicting the structure of the solid-state imaging apparatus of Embodiment 1.
Figure 9B:
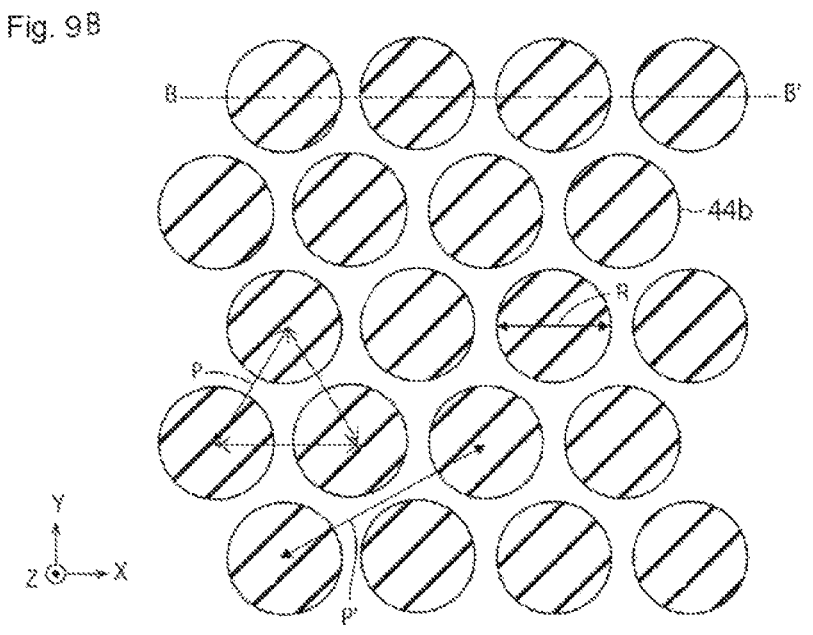

FIGS. 9A-9B indicate a cross-sectional views depicting a structure of the solid-state imaging apparatus of Embodiment 1. FIG. 9A indicates a longitudinal cross-section of the glass cover 44 of Embodiment 1, just like FIG. 8B. FIG. 9B indicates a transverse cross-section of the glass cover 44 of Embodiment 1. FIG. 9B indicates the transverse cross-section along the A-A' line indicated in FIG. 9A, and FIG. 9A indicates the longitudinal cross-section along the B-B' line indicated in FIG. 9B.

As mentioned above, the glass cover 44 of Embodiment 1 includes the main unit portion 44a and the plurality of protruded portion 44b. These protruded portions 44b are formed on the upper surface S of the glass cover 44 in a two-dimensional array form, specifically in a triangular lattice form (see FIG. 9B). Since the shape of each protruded portion 44b is a cylinder, the planar shape of each protruded portion 44b is a circle (see FIG. 9B). The main unit portion 44a and the protruded portions 44b are formed of $SiO_2$ (Si indicates silicon, O indicates oxygen). The protruded portions 44b of Embodiment 1 are not covered by another layer, but are exposed to the air.

FIGS. 9A and 9B indicate the height H of the protruded portion 44b, the diameter R of the protruded portion 44b, and the pitch P of the protruded portions 44b. The pitch P of the protruded portions 44b corresponds to the center distance between the nearest protruded portions 44b. FIG. 9B also indicates the center distance P' between the next nearest protruded portions 44b. P and P' have a relationship of $P'=\sqrt{3} \times P$. FIG. 9A also indicates an incident angle θ of the light that reaches from the substrate 11 to the surface S of the glass cover 44. This incident angle θ indicates an angle between the travelling direction of the light and the +Z direction. The height H, the diameter R and the pitch P of Embodiment 1 are 300 nm, 300 nm and 400 nm respectively. These dimensions will be described in detail later.

Figures 10A, 10B:
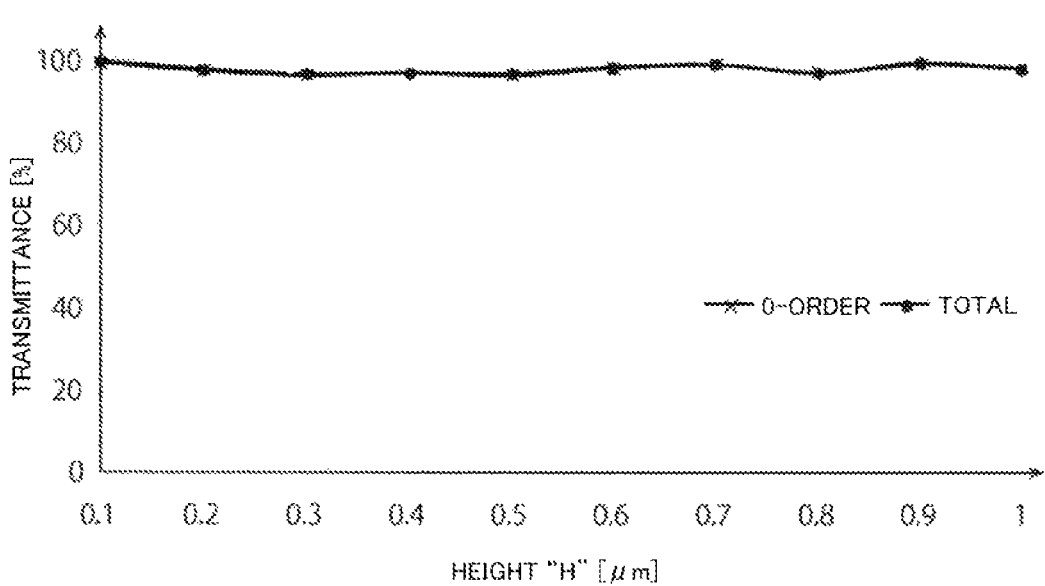
FIGS. 10A-10B indicate a graph for explaining a height H according to Embodiment 1.

FIGS. 10A-10B indicate a graph for explaining the height H according to Embodiment 1. This graph was acquired by a calculation using the FDTD method (the same for other graphs described later).

FIG. 10A indicates a relationship between the height H and the transmittance of a 0° incident light that enters from the air to the glass cover 44. The 0° incident light is an incident light of which angle between the travelling direction of the light and the −Z direction is 0°, that is, an incident light travelling in the −Z direction. FIG. 10B indicates an example of the incident light, the reflected light, the 0-order transmitted light, and the transmitted diffracted light. If the quantity of the transmitted diffracted light is high, the image blurs, hence it is preferable that the quantity of the transmitted diffracted light is low, and the quantity of the 0-order transmitted light is high. It is also preferable that the quantity of the reflected light is low.

FIG. 10A indicates the transmittance of the 0-order transmitted light and the transmittance of the transmitted light in total (transmittance values of the 0-order transmitted light and the transmitted diffracted light). In FIG. 10A, the height H is changed to various values while fixing the diameter R to 0.3 μm and the pitch P to 0.4 μm. According to FIG. 10A, both the transmittance of the 0-order transmitted light and the transmittance of the transmitted light are maintained to approximately 100% even if the height H changes between 0.1 μm and 1.0 μm. This means that in terms of optimizing these transmittance values, the height H may be any value in the 0.1 μm to 1.0 μm range.

Figure 11A:
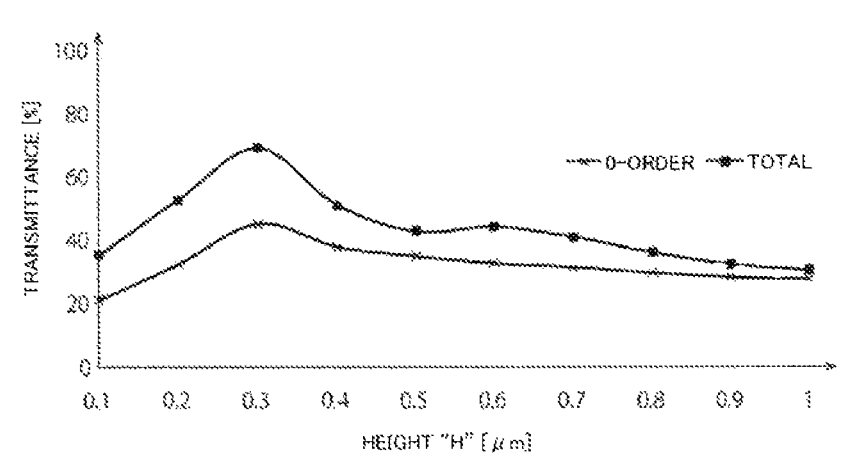
FIGS. 11A-11B indicate a graph for explaining a height H according to Embodiment 1.
Figure 11B:
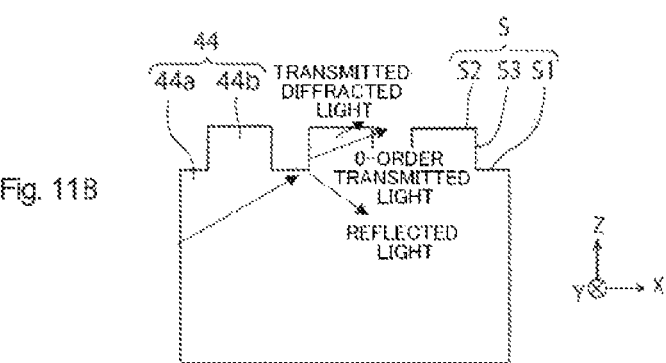

FIGS. 11A-11B indicate a graph for explaining the height H according to Embodiment 1.

FIG. 11A indicates a relationship between the height H and the transmittance of a 43° incident light that enters from the air to the glass cover 44. The 43° incident light is an incident light of which angle between the travelling direction of the light and the +Z direction is 43°, that is, an incident light of which the above mentioned incident angle θ is 43°. FIG. 11B indicates an example of the incident light, the reflected light, the 0-order transmitted light, and the transmitted diffracted light. This reflected light causes a flare. It is preferable that the quantity of the transmitted light is high since the reflected light decreases as the transmitted light increases.

FIG. 11A indicates the transmittance of the 0-order transmitted light and the transmittance of the transmitted light in total. In FIG. 11A, the height H is changed to various values while fixing the diameter R to 0.3 μm and the pitch P to 0.4 μm. According to FIG. 11A, these transmittance values are highest when the height H is 0.3 μm, and decreases as the height H deviates from 0.3 inn. Specifically, these transmittance values suddenly decrease as the height H decreases from 0.3 μm. For example, the transmittance of the 0-order transmitted light at H=0.13 μm is approximately the same as the transmittance of the 0-order transmitted light at H=1.00 μm, that is, the transmittance of the 0-order transmitted light when the height H is less than 0.13 μm is lower than the transmittance of the 0-order transmitted light when the height H is 1.00 μm. Such low transmittance is not desirable. Hence it is preferable that the height H of Embodiment 1 is 0.13 to 1.00 μm (0.13 μm≤H≤1.00 μm).

This preferable condition of the height H is still the same, even when the wavelength of the light is considered. According to FIG. 11A, the transmittance of the 0-order transmitted light and the transmittance of the transmitted light in total are highest when the height H is 0.3 μm. This corresponds to one cycle of a wavelength. The 43° incident light, however, travels in an inclined state with respect to the +Z direction, hence in order to determine the condition of the height H for the 43° incident light, the one cycle of a wavelength must be considered in the inclined state. Therefore in the case of considering the one cycle of a wavelength in the inclined state, it is preferable that the height H has a length of ¼ to 2 wavelengths. The length of ¼ wavelength is approximately 0.13 μm, and the length of 2 wavelengths is approximately 1.00 μm. The values 0.13 μm and 1.00 μm deviate slightly from the precise ¼ wavelength and 2 wavelengths respectively, but this is because a case of replacing the glass cover 44 formed of $SiO_2$ (refractive index: 1.45) with a cover formed of a different material is also considered. An example of such a material is $TiO_2$ (refractive index: 2.5) (Ti indicates titanium).

The angle 43° of the 43° incident light corresponds to the above mentioned total reflection condition. Therefore according to Embodiment 1, generation of the total reflection can be effectively reduced by setting the height H to 0.13 to 1.00 μm.

Figure 12:
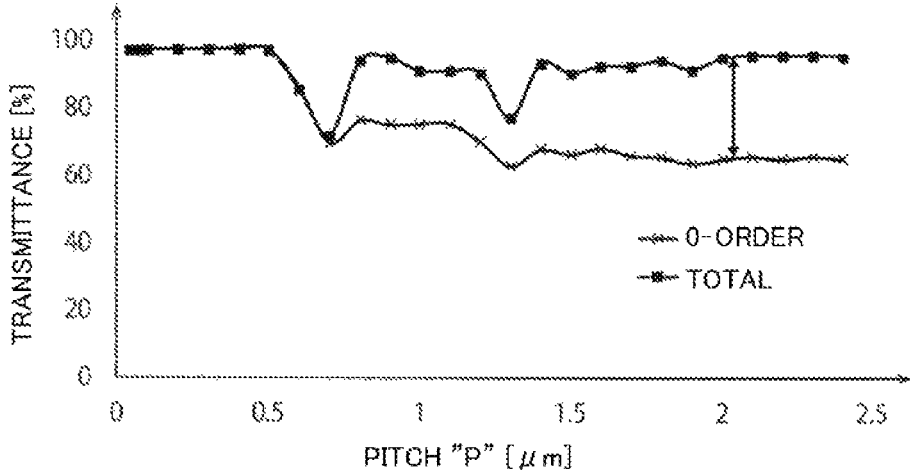
FIG. 12 indicates a graph for explaining a pitch P according to Embodiment 1.

FIG. 12 is a graph for explaining the pitch P according to Embodiment 1.

FIG. 12 indicates a relationship between the pitch P and the transmittance of a 0° incident light that enters from the air to the glass cover 44. Specifically, FIG. 12 indicates the transmittance of the 0-order transmitted light and the transmittance of the transmitted light in total. In FIG. 12, the pitch P is changed to various values while fixing the height H to 0.3 μm. The diameter R is changed such that the later mentioned packaging ratio (R/P) is maintained at 0.75.

According to FIG. 12, in the case where the pitch P is 0.70 μm or less, the transmittance of the 0-order transmitted light is approximately the same as the transmittance of the transmitted light in total, but in the case where the pitch P is more than 0.70 μm, the transmittance of the 0-order transmitted light is lower than the transmittance of the transmitted light in total. This means that the transmitted diffracted light increases when the pitch P is more than 0.70 μm. As mentioned above, it is not desirable that the quantity of the transmitted diffracted light is high. Hence it is preferable that the pitch P of Embodiment 1 is 0.70 μm or less.

On the other hand, a small pitch P is desirable in terms of reducing the transmitted light, but is not desirable in terms of easy to form the protruded portions 44b. For example, if the pitch P is small, photolithography and etching to form the protruded portions 44b become difficult. Hence it is preferable that the lower limit of the desirable pitch P is about ⅓ the upper limit of the desirable pitch P (0.70 μm), that is, about 0.23 μm. This value of 0.23 μm is close to the optimum value of the height H (0.3 μm), hence it is preferable in terms of the shape of the protruded portion 44b as well. If the pitch P is considerably smaller than the height H, the shape of the protruded portion 44b becomes elongated, and reliability of the protruded portion 44b is diminished. Hence it is preferable that the pitch P of Embodiment 1 is 0.23 to 0.70 μm (0.23 μm≤P<0.70 μm). This preferable condition of the pitch P is still the same even if the wavelength of light is considered.

Figure 13:
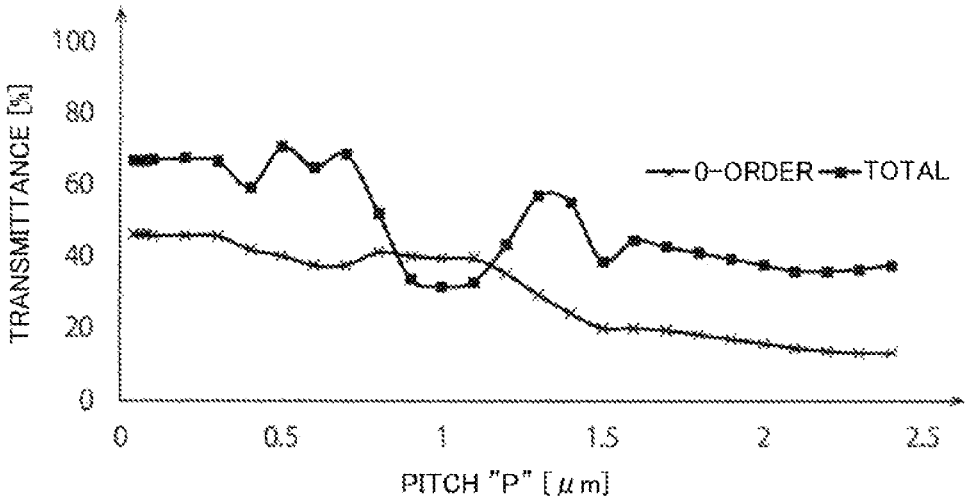
FIG. 13 indicates a graph for explaining a pitch P according to Embodiment 1.

FIG. 13 indicates a graph for explaining the pitch P according to Embodiment 1.

FIG. 13 indicates a relationship between the pitch P and the transmittance of a 43° incident light that enters from the glass cover 44 to the air. Specifically, FIG. 13 indicates the transmittance of the 0-order transmitted light and the transmittance of the transmitted light in total. In FIG. 13, the pitch P is changed to various values while fixing the height H to 0.3 μm. The diameter R is changed such that the later mentioned packaging ratio (R/P) is maintained at 0.75.

In FIG. 13, the transmittance of the 0-order transmitted light and the transmittance of the transmitted light in total are approximately constant when the pitch P is 0.23 to 0.70 μm. Therefore it is preferable that the pitch P of Embodiment 1 is 0.23 to 0.70 μm even if the result of FIG. 13 is considered.

Figure 14:
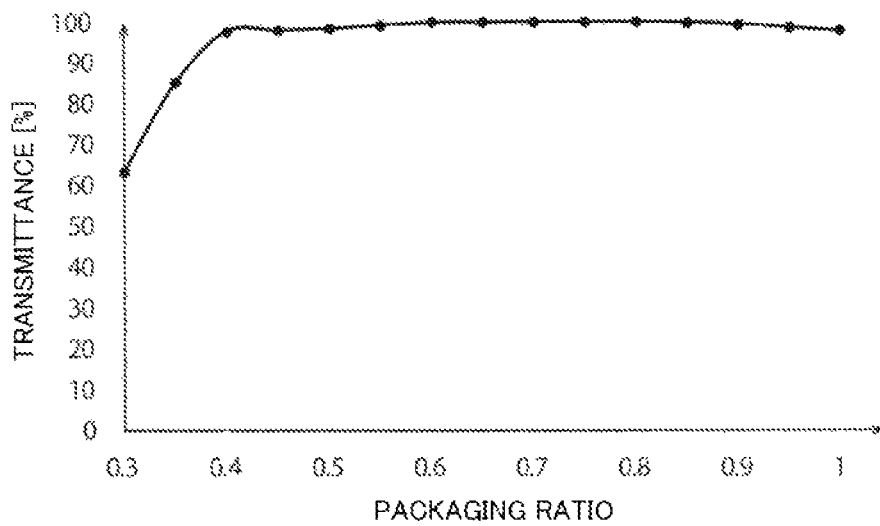
FIG. 14 indicates a graph for explaining a packaging ratio R/P according to Embodiment 1.

FIG. 14 indicates a graph for explaining the packaging ratio R/P according to Embodiment 1.

FIG. 14 indicates a relationship between the packaging ratio R/P of the protruded portion 44b on the upper surface S of the glass cover 44 and the transmittance of the 0° incident light that enters from the air to the glass cover 44. FIG. 14 indicates the transmittance of the transmitted light in total. The packaging ratio R/P indicates the size of the upper surface S2 of the protruded portion 44b with respect to the upper surface S(=S1+S2) of the glass cover 44, and is a value determined by dividing the diameter R by the pitch P. In FIG. 14, the packaging ratio R/P is changed to various values while fixing the height H to 0.3 μm and the diameter R to 0.3 μm. The wavelength of the 0° incident light here is 0.55 μm.

According to FIG. 14, as the packaging ratio R/P decreases, the transmittance of the transmitted light in total decreases. Specifically, when the packaging ratio R/P becomes less than 0.6 (60%), the transmittance starts to drop from 100%, and while the packaging ratio R/P further drops from 0.35 (35%) to 0.3 (30%), the transmittance becomes lower than 80%. As mentioned above, it is not desirable that the transmitted light decreases and the reflected light increases. Therefore the packaging ratio R/P of Embodiment 1 is preferably 35% or more (R/P≥0.35), and is even more preferably 60% or more (R/P≥0.6).

Figure 15:
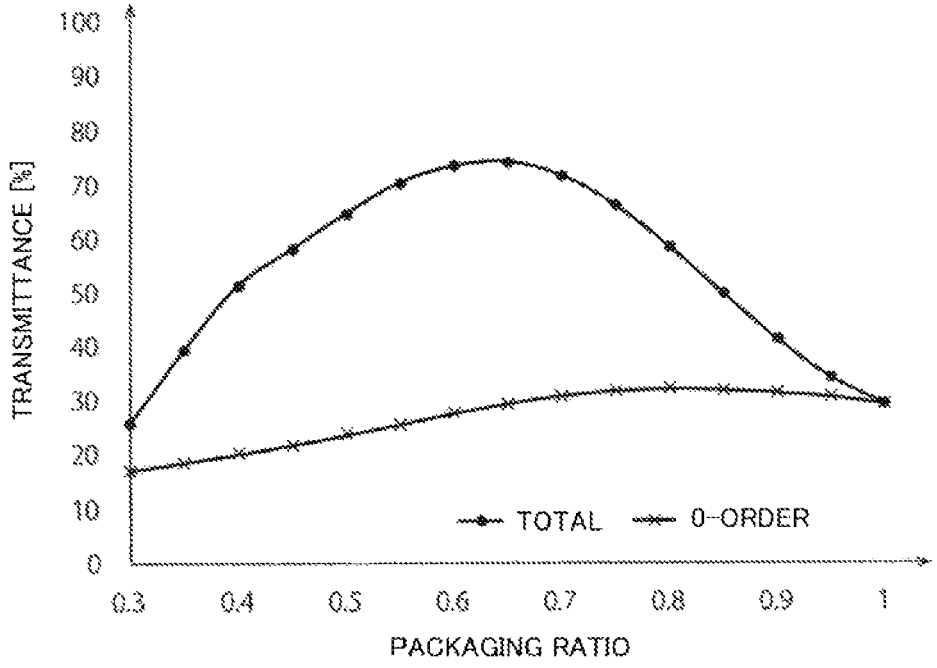
FIG. 15 indicates a graph for explaining a packaging ratio R/P according to Embodiment 1.

FIG. 15 indicates a graph for explaining the packaging ratio R/P according to Embodiment 1.

FIG. 15 indicates a relationship between the packaging ratio R/P of the protruded portion 44b on the upper surface S of the glass cover 44 and the transmittance of the 43° incident light that enters from the glass cover 44 to the air. FIG. 15 indicates the transmittance of the 0-order transmitted light and the transmittance of the transmitted light in total. In FIG. 15, the packaging ratio R/P is changed to various values while fixing the height H to 0.3 μm and the diameter R to 0.3 μm. The wavelength of the 0° incident light here is 0.55 μm.

According to FIG. 15, the transmittance of the 0-order transmitted light increases as the packaging ratio R/P increases, but the transmittance of the transmitted light in total increases as the packaging ratio R/P increases when the packaging ratio R/P is less than about 0.6, and decreases as the packaging ratio R/P decreases when the packaging ratio R/P is about 0.6 or more. As mentioned above, it is not desirable that the transmitted light decreases and the reflected light increases. Therefore the packaging ratio R/P of Embodiment 1 is preferably a value close to 60% in terms of optimizing the 43° incident light.

It is preferable that the height H, the diameter R and the pitch P of Embodiment 1 are set to the above mentioned optimum values. Further, in Embodiment 1, it is preferable to use a combination of these optimum values. For example, it is preferable to set the height H to 0.13 to 1.00 μm, the pitch P to 0.23 to 0.70 μm, and the packaging ratio R/P to 35% or more. Thereby both the transmittance of the 0° incident light that enters from the air to the glass cover 44 and the transmittance of the 43° incident light that enters from the glass cover 44 to the air can be adjusted to optimum values. For example, the shape and the arrangement of the protruded portions 44b can be set so that 97% or more of the transmitted light of the 0° incident light becomes non-diffracted light (0-order transmitted light), and 30% or more of the transmitted light of the 43° incident light becomes non-diffracted light (0-order transmitted light). Thereby a solid-state imaging apparatus having desirable camera characteristics can be implemented.

As mentioned above, the height H, the diameter R, and the pitch P of Embodiment 1 are 300 nm, 300 nm and 400 nm respectively. In the result of the calculation based on the FDTD method performed using these dimensions, 98.5% of the transmitted light of the 0° incident light becomes the 0-order transmitted light, and 44.7% of the transmitted light of the 43° incident light becomes the 0-order transmitted light. This indicates that the generation of a flare can be effectively reduced thereby.

As described above, the solid-state imaging apparatus of Embodiment 1 includes the glass cover 44 which is disposed on the substrate 11 via the on-chip lenses 37, and the glass cover 44 includes a plurality of protruded portions 44*b* that are disposed in a two-dimensional array form on the upper surfaces S of the glass cover 44. Therefore according to Embodiment 1, the glass cover 44 can be suitably disposed on the substrate 11 which includes the photoelectric conversion portion 12. For example, using the protruded portions 44*b*, the negative influence of the reflection diffraction inside the glass cover 44 on an image can be reduced.

Now the structures of solid-state imaging apparatuses of Embodiments 2 to 11 will be described. For the solid-state imaging apparatuses of these embodiments, differences from the solid-state imaging apparatus of Embodiment 1 will be mainly described, and description on the structure in common with the solid-state imaging apparatus of Embodiment 1 will be omitted unless such description is necessary.

Embodiment 2

Figures 16A, 16B:
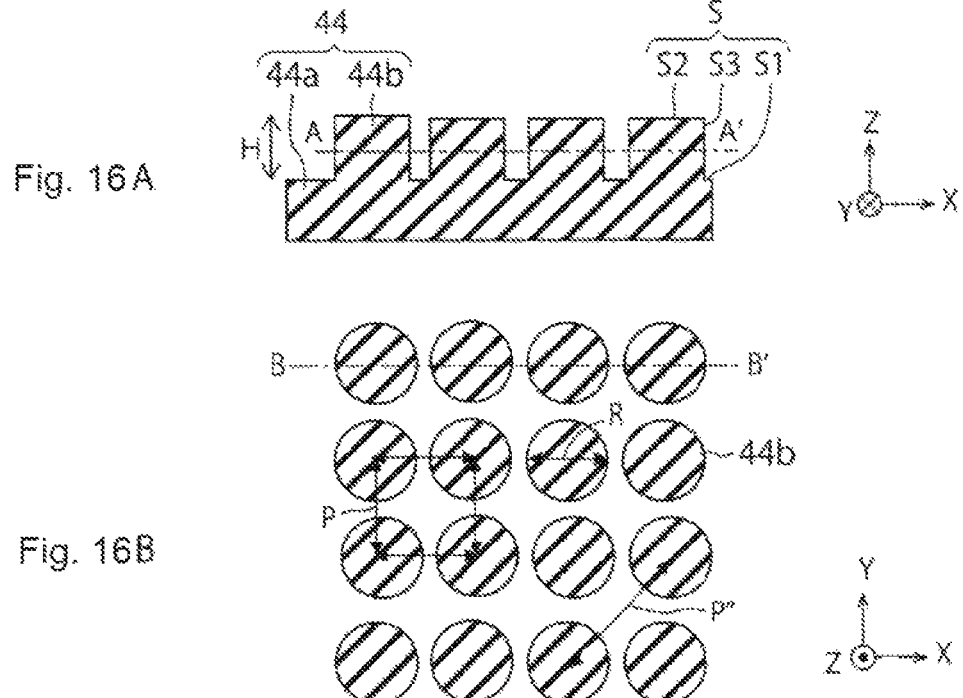
FIGS. 16A-16B indicate cross-sectional views depicting a structure of a solid-state imaging apparatus of Embodiment 2.

FIGS. 16A-16B indicates cross-sectional views depicting a structure of a solid-state imaging apparatus of Embodiment 2. FIG. 16A is a longitudinal cross-sectional view, and FIG. 16B is a transvers cross-sectional view (the same for FIGS. 17 to 25 described later).

The protruded portions 44*b* of Embodiment 2 are disposed in a two-dimensional array form, just like the protruded portions 44*b* of Embodiment 1, but are disposed in a square lattice form, unlike the protruded portions 44*b* of Embodiment 1. FIG. 16B indicates the pitch P of the protruded portions 44*b*, which is the center distance between the nearest protruded portions 44*b* and the center distance P‴ between the next nearest protruded portions 44*b*. P and P′ of Embodiment 1 have a relationship of $P'=\sqrt{3}\times P$, while P and P‴ of Embodiment 2 have a relationship of $P'''=\sqrt{2}\times P$.

The protruded portions 44*b* of Embodiment 1 not only have the cyclic structure of the distance P, but also have the cyclic structure of the distance P′, hence the cyclic structure of the distance P′ also influences the reflection diffraction. In the same manner, the protruded portions 44*b* of Embodiment 2 not only have the cyclic structure of the distance P, but also have the cyclic structure of the distance P‴, hance the cyclic structure of the distance P‴ also influences the reflection diffraction. However, the ratio of P‴ and P(P‴/P) is smaller than the ratio of P′ and P(P′/P), which means that the influence of the cyclic structure of the distance P‴ is normally greater than the influence of the cyclic structure of the distance P′. Therefore in order to reduce the influence of the cyclic structure of the next nearest protruded portions 44*b* on each other, it is preferable to use a triangular lattice as in Embodiment 1, rather than the square lattice as in Embodiment 2.

Embodiment 3

Figures 17A, 17B:
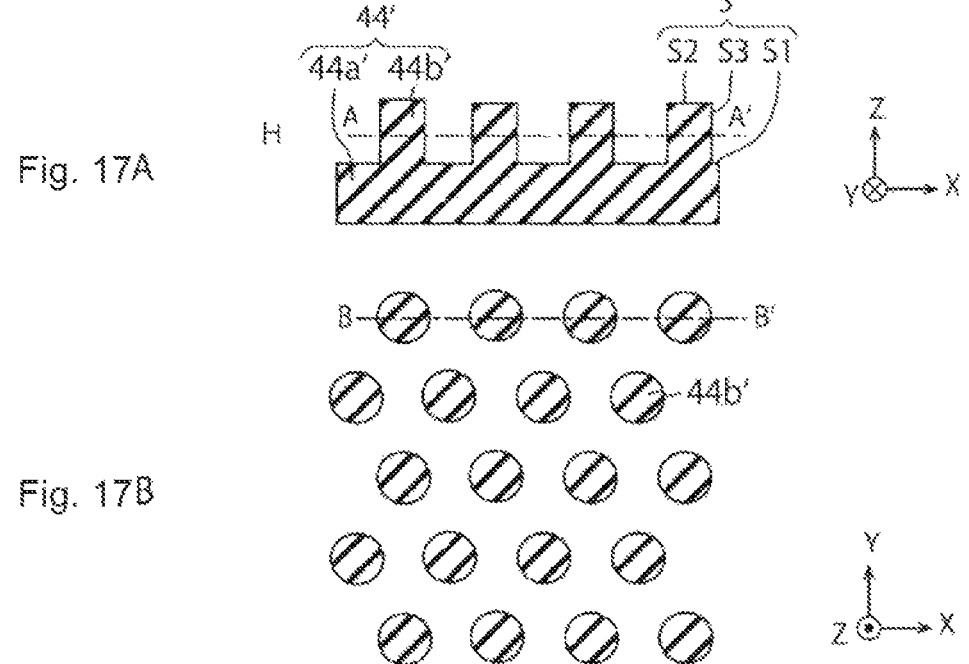
FIGS. 17A-17B indicate cross-sectional views depicting a structure of a solid-state imaging apparatus of Embodiment 3.

FIGS. 17A-17B indicate cross-sectional views depicting a structure of a solid-state imaging apparatus of Embodiment 3.

The solid-state imaging apparatus of Embodiment 3 includes a translucent cover 44' instead of the glass cover 44. The protruded portions 44*b* of the glass cover 44 of Embodiment 1 are formed of $SiO_2$, but the protruded portions 44*b*' of Embodiment 3 are formed of $TiO_2$. Thereby effects similar to the protruded portions 44*b* of Embodiment 1 can be acquired. The translucent cover 44' is an example of the translucent member of the present disclosure.

The translucent cover 44' of Embodiment 3 includes a main unit portion 44*a*' and a plurality of protruded portions 44*b*' which protrude from the main unit portion 44*a*' in the +Z direction. The main unit portion 44*a*' may be formed of $TiO_2$ just like the protruded portions 44*b*', but may be formed of a material other than $TiO_2$ (e.g. $SiO_2$).

The protruded portions 44*b*' of Embodiment 3 may be formed of a material other than $SiO_2$ and $TiO_2$. Examples of such a material are SiN, $Al_2O_3$, $HfO_2$, $TiO_2$ and STO (Strontium Titanium Oxide). Here N indicates nitrogen, Al indicates aluminum and Hf indicates hafnium.

Embodiment 4

Figures 18A, 18B:
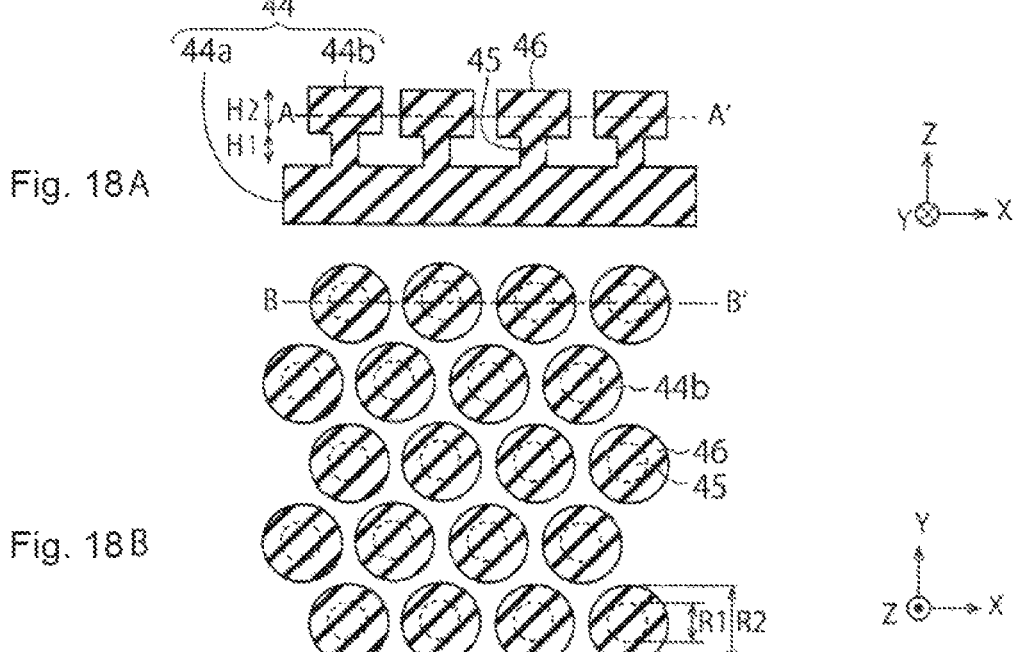
FIGS. 18A-18B indicate cross-sectional views depicting a structure of a solid-state imaging apparatus of Embodiment 4.

FIGS. 18A-18B indicate cross-sectional views depicting a structure of a solid-state imaging apparatus of Embodiment 4.

As indicated in FIG. 18A, each protruded portion 44*b* of Embodiment 4 includes a lower portion 45, and an upper portion 46 which is disposed on the lower portion 45. The shapes of the lower portion 45 and the upper portion 46 are both cylindrical. The projection area of the upper portion 46, however, is set to be larger than the projection area of the lower portion 45. The projection areas of the lower portion 45 and the upper portion 46 are areas acquired when the lower portion 45 and the upper portion 46 are projected onto the XY plane respectively, and are the same as the areas of the transvers cross-sections of the lower portion 45 and the upper portion 46 respectively in Embodiment 4. The lower portion 45 is an example of the first portion of the present disclosure, and the upper portion 46 is an example of the second portion of the present disclosure.

FIG. 18A indicates a height H1 of the lower portion 45 and a height H2 of the upper portion 46. These heights H1 and H2 have a relationship of H=H1+H2. FIG. 18B indicates a diameter R1 of the lower portion 45 and a diameter R2 of the upper portion 46. These diameters R1 and R2 have a relationship of R2>R1. An example of the values of these dimensions is: H1=300 nm, H2=300 nm, R1=160 nm and R2=320 nm. Both the lower portion 45 and the upper portion 46 of Embodiment 4 are formed of $SiO_2$.

According to Embodiment 4, the protruded portion 44*b* having a shape close to a cone or the protruded portion 44*b* having a longitudinal cross-sectional shape close to a trapezoid can be easily formed. Further, according to Embodiment 4, the way of propagation of the light can be adjusted by changing the ratio of H1 and H2 or by changing the ratio of R1 and R2.

Embodiment 5

Figures 19A, 19B:
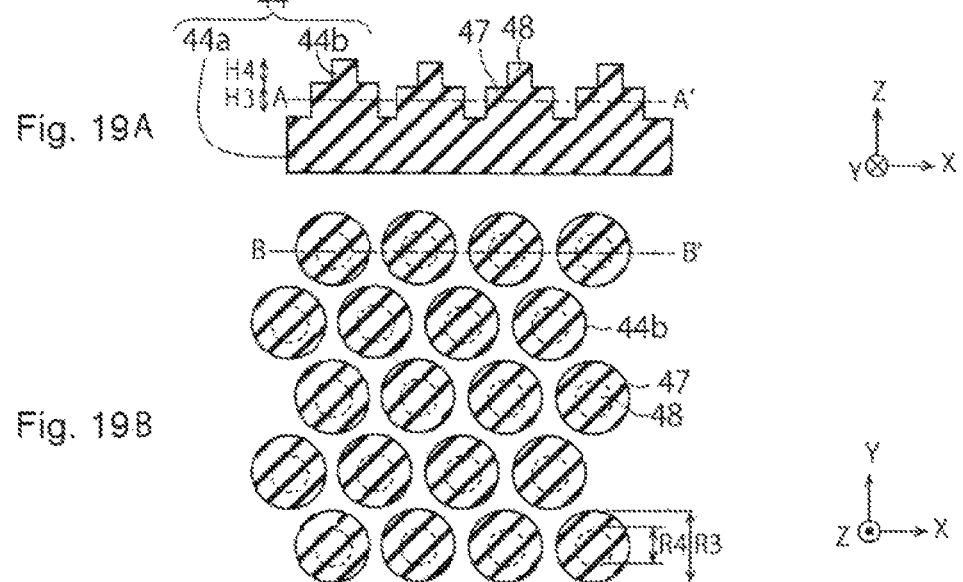
FIGS. 19A-19B indicate cross-sectional views depicting a structure of a solid-state imaging apparatus of Embodiment 5.

FIGS. 19A-19B indicate cross-sectional views depicting a structure of a solid-state imaging apparatus of Embodiment 5.

As indicated in FIG. 19A, each protruded portion 44*b* of Embodiment 5 includes a lower portion 47, and an upper portion 48 which is disposed on the lower portion 47. The shapes of the lower portion 47 and the upper portion 48 are both cylindrical. The projection area of the upper portion 48, however, is set to be smaller than the projection area of the lower portion 47. The projection areas of the lower portion 47 and the upper portion 48 are areas acquired when the lower portion 47 and the upper portion 48 are projected onto the XY plane respectively, and are the same as the areas of the transverse cross-sections of the lower portion 47 and the upper portion 48 respectively of Embodiment 5. The lower portion 47 is an example of the first portion of the present disclosure, and the upper portion 48 is an example of the second portion of the present disclosure.

FIG. 19A indicates a height H3 of the lower portion 47 and a height H4 of the upper portion 48. These heights H3 and H4 have a relationship of H=H3+H4. FIG. 19B indicates a diameter R3 of the lower portion 47 and a diameter R4 of the upper portion 48. These diameters R3 and R4 have a relationship of R4<R3. An example of the values of these dimensions is: H3=300 nm, H4=200 nm, R3=320 nm and R4=160 nm. Both the lower portion 47 and the upper portion 48 of Embodiment 5 are formed of $SiO_2$.

According to Embodiment 5, the protruded portion 44b having a shape close to a cone, or the protruded portion 44b having a longitudinal cross-sectional shape close to a trapezoid can be easily formed. Further, according to Embodiment 5, the way of propagation of the light can be adjusted by changing the ratio of H3 and H4 or by changing the ratio of R3 and R4.

Embodiment 6

Figures 20A, 20B:
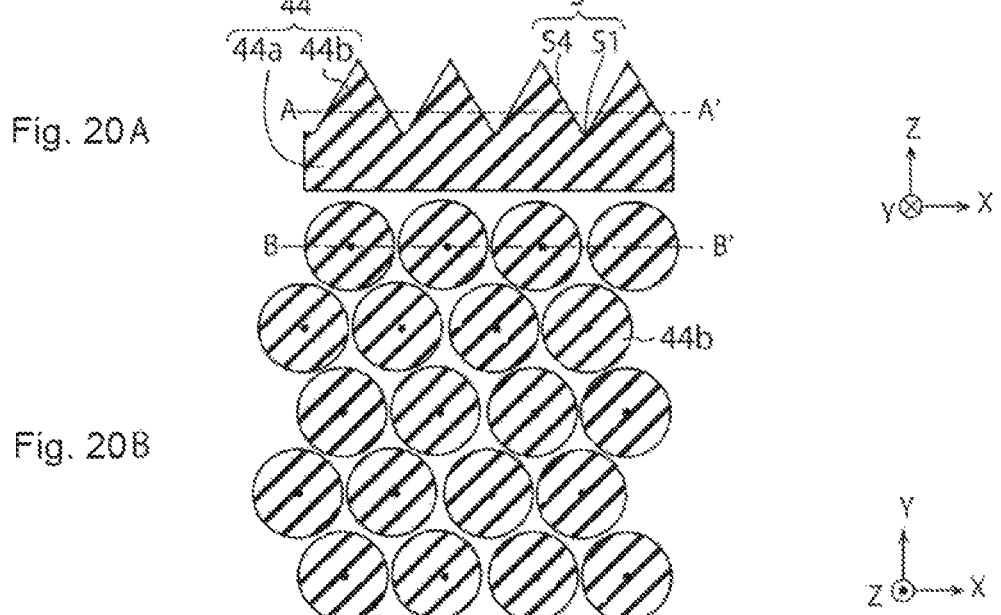
FIGS. 20A-20B indicate cross-sectional views depicting a structure of a solid-state imaging apparatus of Embodiment 6.

FIGS. 20A-20B indicate cross-sectional views depicting a structure of a solid-state imaging apparatus of Embodiment 6.

As indicated in FIG. 20A, the shape of each protruded portion 44b of Embodiment 6 is a cone. The upper surface S of the glass cover 44 of Embodiment 6 includes the upper surface 51 of the main unit portion 44a and the upper surface S4 of each protruded portion 44b. The upper surface 51 of the main unit portion 44a and the upper surface S4 of each protruded portion 44b are directly connected. In Embodiment 6, the upper surface 51 is a horizontal surface that is parallel with the XY plane, and the upper surface S4 is an inclined surface inclined with respect to the XY plane.

The methods for determining the height H, the diameter R and the pitch P of the protruded portion 44b are the same as the case of Embodiment 1 (see FIGS. 9A and 9B). The diameter R of the protruded portion 44b here, however, indicates the diameter of the bottom portion of the protruded portion 44b. The values of the height H, the diameter R and the pitch P of Embodiment 6 are: 240 nm, 293 nm and 450 nm respectively, for example.

According to the protruded portions 44b of Embodiment 6, effects similar to the protruded portions 44b of Embodiment 1 can be acquired.

Embodiment 7

Figures 21A, 21B:
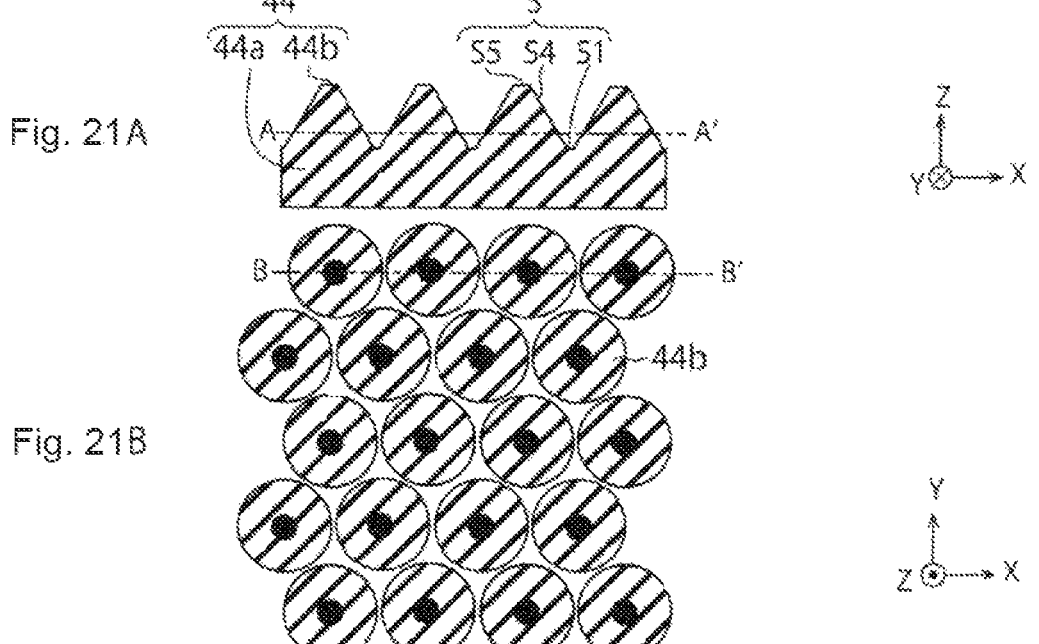
FIGS. 21A-21B indicate cross-sectional views depicting a structure of a solid-state imaging apparatus of Embodiment 7.

FIGS. 21A-21B indicate cross-sectional views of a structure of a solid-state imaging apparatus of Embodiment 7.

As indicated in FIG. 21A, the shape of each protruded portion 44b of Embodiment 7 is a cone of which tip of cutoff. This means that the longitudinal cross-sectional shape (vertical cross-sectional shape) of each protruded portion 44b of Embodiment 7 is a trapezoid. The upper surface S of the glass cover 44 of Embodiment 7 includes the upper surface 51 of the main unit portion 44a, the upper surface S4 of each protruded portion 44b, and the upper surface S5 on the top of the protruded portion 44b. The upper surface 51 of the main unit portion 44a and the upper surface S5 of the protruded portion 44b are connected via the upper surface S4 of the protruded portion 44b. In Embodiment 7, the upper surface 51 is a horizontal surface that is parallel with the XY plane, the upper surface S4 is an inclined surface inclined with respect to the XY plane, and the upper surface S5 is a horizontal surface that is parallel with the XY plane.

The method for determining the height H, the diameter R and the pitch P of the protruded portion 44b is the same as the case of Embodiment 1 (see FIGS. 9A and 9B). The diameter R of the protruded portion 44b here, however, indicates the diameter of the bottom portion of the protruded portion 44b. The values of the height H, the diameter R and the pitch P of Embodiment 7 are: 170 nm, 293 nm and 450 nm respectively, for example. The diameter of the upper surface S5 of Embodiment 7 is 146 nm, for example.

According to the protruded portions 44b of Embodiment 7, effects similar to the protruded portions 44b of Embodiment 1 can be acquired. Further, according to Embodiment 7, a protruded portion 44b having an intermediate characteristic between the cylindrical protruded portion 44b and the conical protruded portion 44b can be implemented.

Embodiment 8

Figures 22A, 22B:
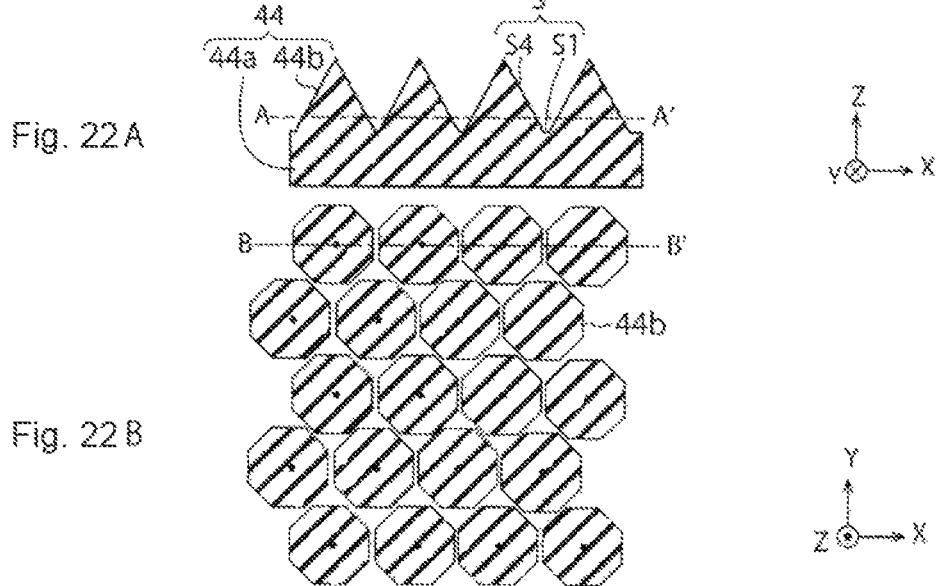
FIGS. 22A-22B indicate cross-sectional views depicting a structure of a solid-state imaging apparatus of Embodiment 8.

FIGS. 22A-22B indicate cross-sectional views depicting a structure of a solid-state imaging apparatus of Embodiment 8.

As indicated in FIG. 20A, the shape of each protruded portion 44b of Embodiment 8 is a pyramid, more specifically, an octagonal pyramid. Hence the planar shape of each protruded portion 44b of Embodiment 8 is a polygon (octagon), as indicated in FIG. 20B. The upper surface S of the glass cover 44 of Embodiment 8 includes the upper surface 51 of the main unit portion 44a and the upper surface S4 of each protruded portion 44b. The upper surface 51 of the main unit portion 44a and the upper surface S4 of the protruded portion 44b are directly connected. In Embodiment 8, the upper surface 51 is a horizontal surface that is parallel with the XY plane, and the upper surface S4 is an inclined surface inclined with respect to the XY plane.

According to the protruded portions 44b of Embodiment 8, effects similar to the protruded portions 44b of Embodiment 1 can be acquired. The shape of each protruded portion 44b may be a pyramid other than an octagonal pyramid. In this case, the planar shape of each protruded portion 44b is a polygon other than an octagon, such as a triangle, a square and a hexagon. The shape of each protruded portion 44b may be a prism, such as a triangular prism, a rectangular prism and a hexagonal prism. In this case, the planar shape of each protruded portion 44b is a polygon, such as a triangle, a square and a hexagon.

Embodiment 9

Figures 23A, 23B:
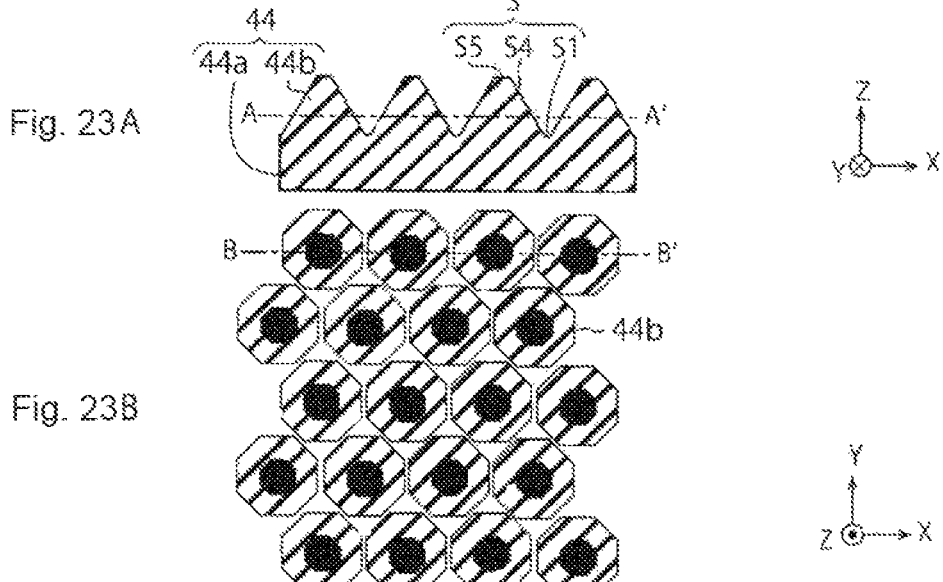
FIGS. 23A-23B indicate cross-sectional views depicting a structure of a solid-state imaging apparatus of Embodiment 9.

FIGS. 23A-23B indicate cross-sectional views depicting a structure of a solid-state imaging apparatus of Embodiment 9.

As indicated in FIG. 23A, the shape of each protruded portion 44b of Embodiment 9 is a pyramid of which tip is cutoff. This means that the longitudinal cross-sectional shape (vertical cross-sectional shape) of each protruded portion 44b of Embodiment 9 is a trapezoid. The upper surface S of the glass cover 44 of Embodiment 9 includes the upper surface 51 of the main unit portion 44a, the upper surface S4 of each protruded portion 44b, and the upper surface S5 on top of the protruded portion 44b. The upper surface 51 of the main unit portion 44a and the upper surface S5 of the protruded portion 44b are connected via the upper surface S4 of the protruded portion 44*b*. In Embodiment 9, the upper surface 51 is a horizontal surface that is parallel with the XY plane, the upper surface S4 is an inclined surface inclined with respect to the XY plane, and the upper surface S5 is a horizontal surface that is parallel with the XY plane.

According to the protruded portions 44*b* of Embodiment 9, effects similar to the protruded portions 44*b* of Embodiment 1 can be acquired. Further, according to Embodiment 9, a protruded portion 44*b* having an intermediate characteristic between the protruded portion 44*b* of the prism and the protruded portion 44*b* of the pyramid can be implemented. In this case, a number of vertexes of the bottom face of the prism or a number of vertexes of the bottom face of the pyramid may be arbitrary.

Embodiment 10

Figures 24A, 24B:
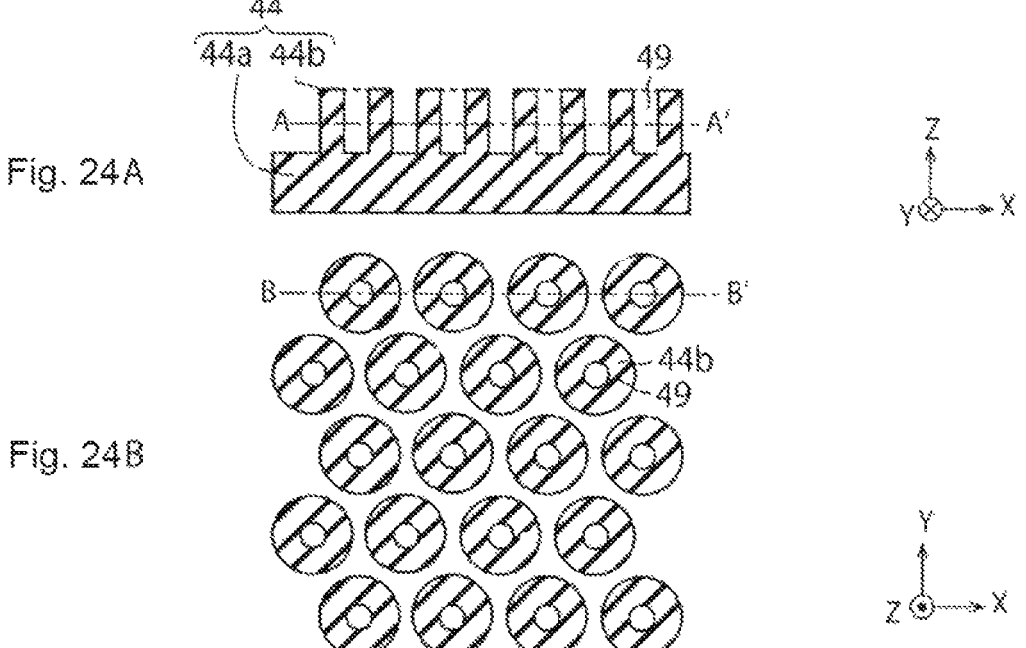
FIGS. 24A-24B indicate cross-sectional views depicting a structure of a solid-state imaging apparatus of Embodiment 10.

FIGS. 24A-24B indicate cross-sectional views depicting a solid-state imaging apparatus of Embodiment 10.

As indicated in FIG. 24A, the shape of each protruded portion 44*b* of Embodiment 10 is a cylinder, inside which a recessed portion 49, extending in the Z direction, is formed. The depth of the recessed portion 49 of Embodiment 10 is the same as the height H of the protruded portion 44*b* (see FIG. 9A), but may be deeper or shallower than the height H of the protruded portion 44*b*. According to Embodiment 10, the way of propagation of the light can be adjusted by changing the shape of the recessed portion 49.

Embodiment 11

Figures 25A, 25B:
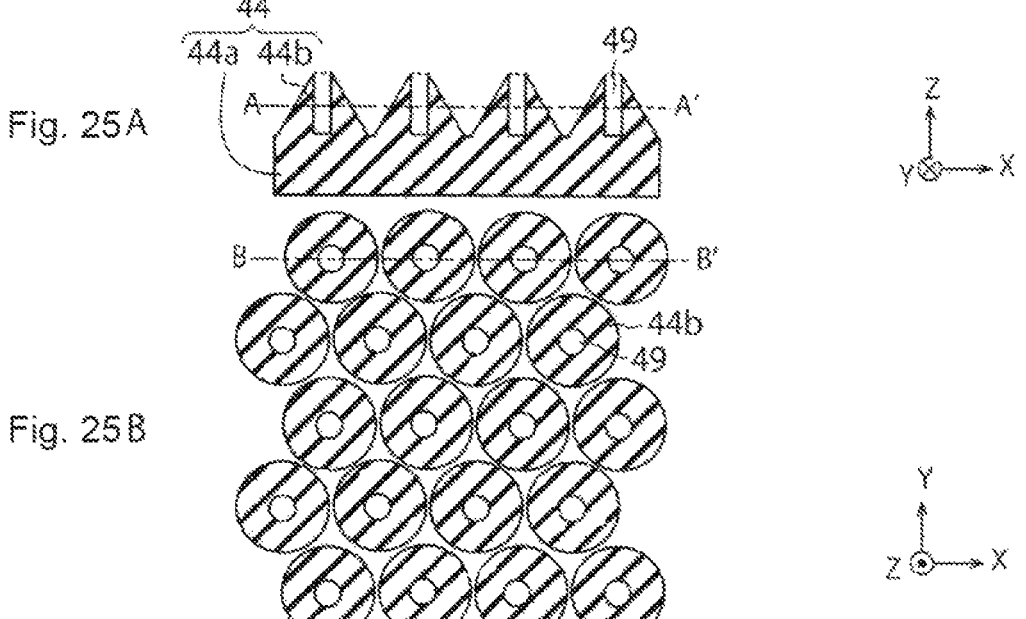
FIGS. 25A-25B indicate cross-sectional views depicting a structure of a solid-state imaging apparatus of Embodiment 11.

FIGS. 25A-25B indicate cross-sectional views depicting a structure of a solid-state imaging apparatus of Embodiment 11.

As indicated in FIG. 25A, the shape of each protruded portion 44*b* of Embodiment 11 is a cone, inside which a recessed portion 49, extending in the Z direction, is formed. The depth of the recessed portion 49 of Embodiment 11 is the same as the height H of the protruded portion 44*b*, but may be deeper or shallower than the height H of the protruded portion 44*b*. According to Embodiment 11, the way of propagation of the light can be adjusted by changing the shape of the recessed portion 49.

The recessed portion 49 of Embodiment 10 or 11 may be formed inside a solid other than a cylinder and a cone. Examples of the solid are a prism and a pyramid. In this case, a number of vertexes of the bottom face of the prism or a number of vertexes of the bottom face of the pyramid may be arbitrary. Further, the shape of the recessed portion 49 of Embodiment 10 or 11 may be a shape other than the cylinder, and may be a prism, for example. In this case as well, a number of vertexes of the bottom face of the prism may be arbitrary.

Graphs of Embodiments 1 and 5

Figure 26:
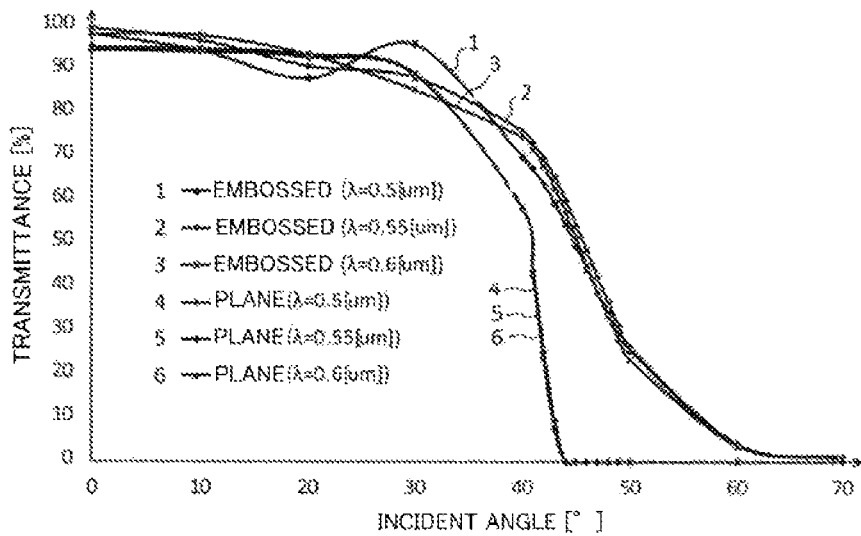
FIG. 26 indicates a graph for explaining transmittance according to Embodiment 1.
Figure 27:
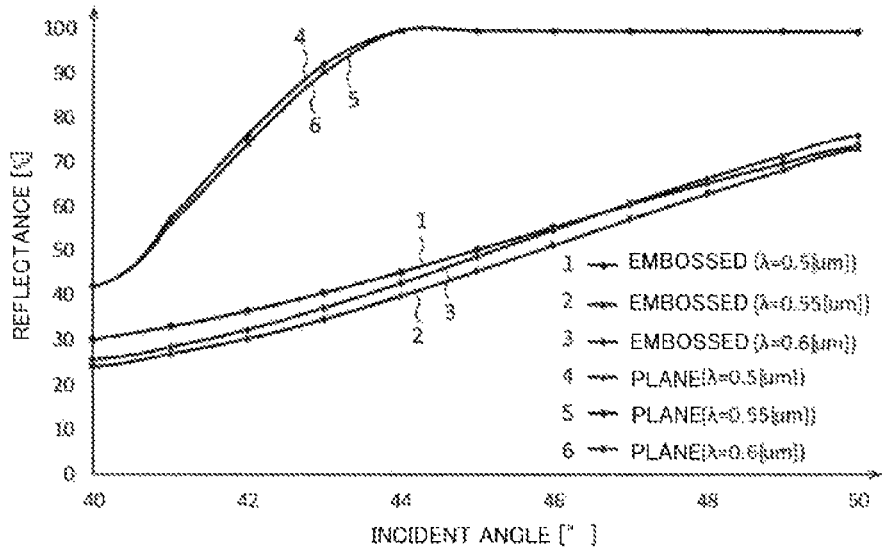
FIG. 27 indicates a graph for explaining reflectance according to Embodiment 1.

FIG. 26 is a graph for explaining the transmittance in Embodiment 1. FIG. 27 is a graph for explaining the reflectance in Embodiment 1. As mentioned above, the solid-state imaging apparatus of Embodiment 1 includes a plurality of protruded portions 44*b* having a cylindrical shape respectively.

FIG. 26 indicates the transmittance values of incident lights that enter from the glass cover 44 to the air at various incident angles. FIG. 27 indicates the reflectance values of incident lights that enter from the glass cover 44 to the air at various incident angles. For comparison, FIGS. 26 and 27 indicate not only curves 1 to 3 acquired in the case where the glass cover 44 includes the protruded portions 44*b*, but also curves 4 to 6 acquired in the case where the glass cover 44 does not include the protruded portions 44*b*. The curves 1 to 3 indicate the transmittance values when the wavelengths of the incident lights are 0.5 μm, 0.55 μm and 0.6 μm respectively. In the same manner, the curves 4 to 6 indicate the reflectance values when the wavelengths of the incident lights are 0.5 μm, 0.55 μm and 0.6 μm respectively.

FIG. 26 indicates that the transmittance of the incident light increases if the protruded portions 44*b* are disposed on the glass cover 44. For example, in a case where the incident angle is 40°, the transmittance values of the curves 4 to 6 are lower than 40%, but the transmittance values of the curves 1 to 3 are higher than 80%.

FIG. 27 indicates that the reflectance of the incident light decreases if the protruded portions 44*b* are disposed on the glass cover 44. For example, in the case where the incident angle is 43°, the reflectance values of the curves 4 to 6 are higher than 80%, but the reflectance values of the curves 1 to 3 are lower than 40%.

Figure 28:
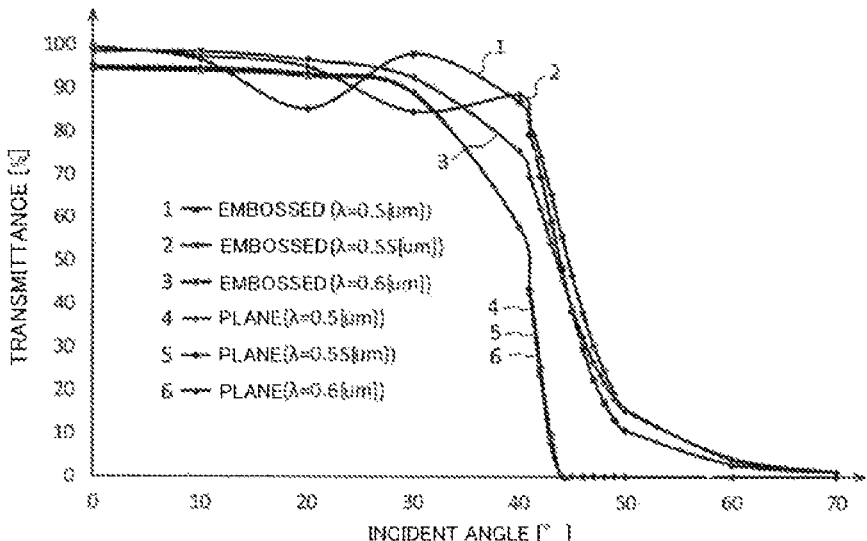
FIG. 28 indicates a graph for explaining transmittance according to Embodiment 5.
Figure 29:
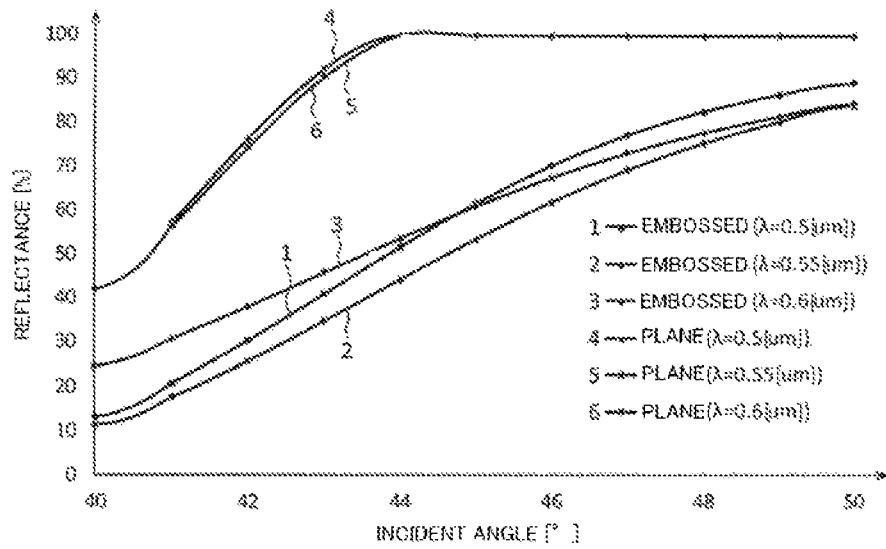
FIG. 29 indicates a graph for explaining reflectance according to Embodiment 5.

FIG. 28 is a graph for explaining the transmittance in Embodiment 5. FIG. 29 is a graph for explaining the reflectance in Embodiment 5. The solid-state imaging apparatus of Embodiment 5 includes a plurality of protruded portions 44*b*, each of which has a shape constituted of the lower portion 47 and the upper portion 48 respectively, as mentioned above.

FIG. 28 indicates the transmittance values of incident lights that enter from the glass cover 44 to the air at various incident angles. FIG. 29 indicates the reflectance values of incident lights that enter from the glass cover 44 to the air at various incident angles. For comparison, FIGS. 28 and 29 indicate not only curves 1 to 3 acquired in the case where the glass cover 44 includes the protruded portions 44*b*, but also includes curves 4 to 6 acquired in the case where the glass cover 44 does not include the protruded portions 44*b*. The curves 1 to 3 indicate transmittance values when the wavelengths of the incident lights are 0.5 μm, 0.55 μm and 0.6 μm respectively. In the same manner, the curves 4 to 6 indicate reflectance values when the wavelengths of the incident lights are 0.5 μm, 0.55 μm and 0.6 μm respectively.

FIG. 28 indicates that the transmittance of the incident light increases if the protruded portions 44*b* are disposed on the glass cover 44. For example, in the case where the incident angle is 40°, the transmittance values of the curves 4 to 6 are lower than 40%, but the transmittance values of the curves 1 to 3 are higher than 80%.

FIG. 29 indicates that the reflectance of the incident light decreases if the protruded portions 44*b* are disposed on the glass cover 44. For example, in the case where the incident angle is 43°, the reflectance values of the curves 4 to 6 are higher than 80%, but the reflectance values of the curves 1 to 3 are lower than 40%.

As described above, according to Embodiments 1 and 5, the negative influence of the reflection diffraction inside the glass cover 44 on the image quality can be reduced by disposing the protruded portions 44*b* on the glass cover 44. This is the same for the other embodiments.

Embodiment 12

Figure 30:
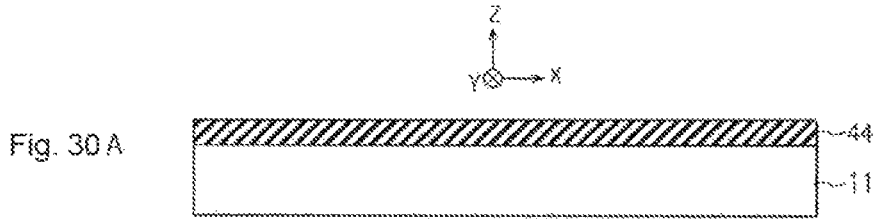
FIGS. 30A-30C indicate cross-sectional views depicting a method for manufacturing a solid-state imaging apparatus of Embodiment 12 (1/2).
Figure 30:
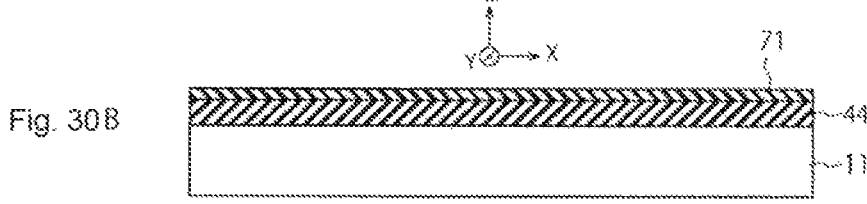
Figure 30:
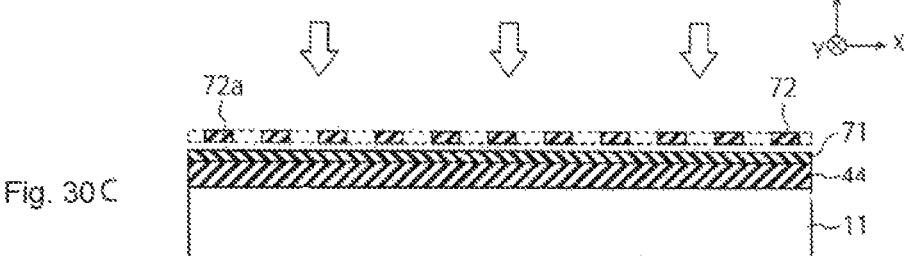

FIGS. 30 and 31 indicate cross-sectional views depicting a method for manufacturing a solid-state imaging apparatus of Embodiment 12. In the method of Embodiment 12, the solid-state imaging apparatus of Embodiment 1 is manufactured, but the solid-state imaging apparatuses of the other embodiments may be manufactured, as described later.

First the substrate 11 is prepared (FIG. 30A). Then the photoelectric conversion portion 12 and the like are formed in the substrate 11; the wiring layers 22 to 24, the interlayer insulation film 25 and the like are formed on the front surface of the substrate 11; the on-chip lens 37 and the like are formed on the rear surface of the substrate 11; and the substrate 11 is disposed on the support substrate 21. Illustrations of the photoelectric conversion portion 12, the wiring layers 22 to 24, the interlayer insulation film 25, the on-chip lenses 37, the support substrate 21 and the like are omitted here.

Then the glass cover 44 is attached onto the rear surface of the substrate 11 via the on-chip lenses 37 and the glass seal resin 43, which are not illustrated (FIG. 30A). The glass cover 44 of Embodiment 12 is a glass substrate, for example.

Then a photoresist layer 71 is formed on the glass cover 44 (FIG. 30B). Then the photoresist layer 71 is exposed by lithography using a photomask 72 (FIG. 30C). FIG. 30C indicates a shielding portion 72*a* included in the photomask 72. Light which was not shielded by the shielding portion 72*a* is emitted to the photoresist layer 71.

Figure 31A:
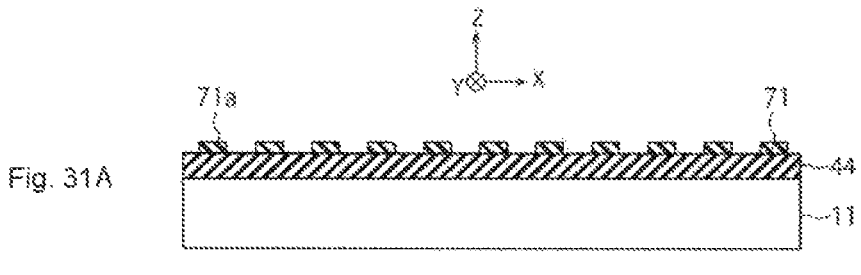
FIGS. 31A-31C indicate cross-sectional views depicting the method for manufacturing a solid-state imaging apparatus of Embodiment 12 (2/2).

Then the photoresist layer 71 is developed by etching (FIG. 31A). As a result, the photoresist layer 71 is patterned, as illustrated in FIG. 31A. FIG. 31A indicates a plurality of resist portions 71*a*, which are residual portions of the photoresist layer 71.

Figure 31B:
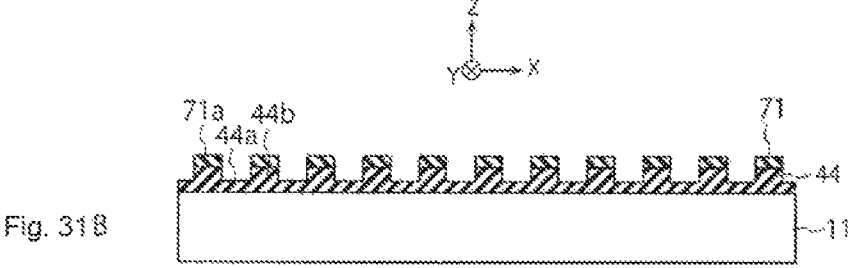

Then the glass cover 44 is processed by etching using the photoresist layer 71 as a mask (FIG. 31B). As a result, the shape of the resist portions 71*a* is transferred to the glass cover 44, and the plurality of protruded portions 44*b* are formed on the upper surface of the glass cover 44. FIG. 31B indicates the main unit portion 44*a* of the glass cover 44 and these protruded portions 44*b*. The protruded portions 44*b* of Embodiment 12 are formed in a two-dimensional array form, as mentioned above.

Figure 31C:
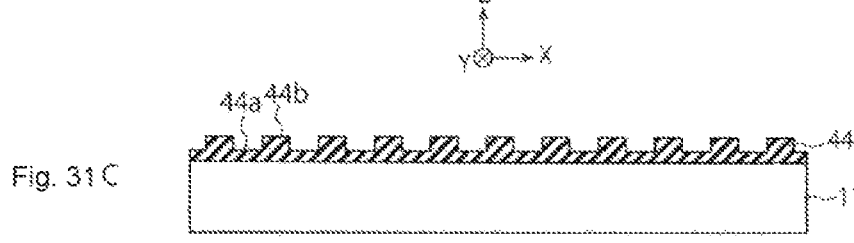

Then the photoresist layer 71 is removed and the glass cover 44 is cleaned (FIG. 31C). In this way, the solid-state imaging apparatus of Embodiment 1 is manufactured.

Any one of the solid-state imaging apparatuses of Embodiments 2 to 11 may be manufactured using the method of Embodiment 12. For example, in the case of setting the shape of the protruded portion 44*b* to a prism instead of a cylinder, the shape of each resist portion 71*a* may be set to a prism instead of a cylinder. In the case of setting the shape of the protruded portion 44*b* to a cone or a pyramid, the shape of each resist portion 71*a* may be set to a cone or a pyramid, or the glass cover 44 may be etched back by the etching in FIG. 31B. Furthermore, the recessed portion 49 may be formed inside each protruded portion 44*b* by the etching in FIG. 31B or a different kind of etching.

Embodiments of the present disclosure have been described, but these embodiments may be modified in various ways within the scope of not departing from the spirit of the disclosure. For example, at least two embodiments may be combined.

The present disclosure may have the following configuration.

(1) A solid-state imaging apparatus including: a substrate that includes a photoelectric conversion portion; a lens that is disposed on the substrate; and a translucent member that is disposed on the lens, wherein the translucent member includes a plurality of protruded portions that are disposed in a two-dimensional array form on an upper surface of the translucent member.

(2) The solid-state imaging apparatus according to (1), wherein the height of the protruded portion is 0.13 to 1.00 µm.

(3) The solid-state imaging apparatus according to (1), wherein a pitch of the protruded portions is 0.23 to 0.70 µm.

(4) The solid-state imaging apparatus according to (1), wherein a packaging ratio of the protruded portions on the upper surface of the translucent member is 35% or more.

(5) The solid-state imaging apparatus according to (4), wherein the packaging ratio of the protruded portions on the upper surface of the translucent member is 60% or more.

(6) The solid-state imaging apparatus according to (1), wherein the protruded portions are disposed so that 97% or more of transmitted light of the light, which entered the upper surface of the translucent member from a subject side at a 0° incident angle, becomes a non-diffracted light, and 30% or more of transmitted light, of the light which entered the upper surface of the translucent member from the substrate side at a 43° incident angle, becomes a non-diffracted light.

(7) The solid-state imaging apparatus according to (1), wherein the shape of the protruded portion is a cylinder, a prism, a cone or a pyramid.

(8) The solid-state imaging apparatus according to (1), wherein the protruded portion includes a first portion, and a second portion that is disposed on the first portion and has a projection area larger than the first portion.

(9) The solid-state imaging apparatus according to (1), wherein the protruded portion includes a first portion, and a second portion that is disposed on the first portion and has a projection area smaller than the first portion.

(10) The solid-state imaging apparatus according to (1), wherein a shape of a vertical cross-section of the protruded portion is a trapezoid.

(11) The solid-state imaging apparatus according to (1), wherein the protruded portion includes a recessed portion which extends in the vertical direction inside the protruded portion.

(12) The solid-state imaging apparatus according to (1), wherein a planar shape of the protruded portion is a circle or a polygon.

(13) The solid-state imaging apparatus according to (1), wherein the protruded portions are formed on the upper surface of the translucent member in a triangular lattice form.

(14) The solid-state imaging apparatus according to (1), wherein the protruded portions are exposed to the air.

(15) The solid-state imaging apparatus according to (1), wherein the protruded portion is formed of $SiO_2$, SiN, $Al_2O_3$, $HfO_2$, $TiO_2$ or STO (strontium titanium oxide) (where Si is silicon, O is oxygen, N is nitrogen, Al is aluminum, Hf is hafnium and Ti is titanium).

(16) The solid-state imaging apparatus according to (1), wherein the translucent member is a glass cover.

(17) The solid-state imaging apparatus according to (1), wherein the translucent member is adhered to the substrate.

(18) A method for manufacturing a solid-state imaging apparatus, including steps of: disposing a translucent member on a substrate that includes a photoelectric conversion portion via a lens; and forming a plurality of protruded portions in a two-dimensional array form on an upper surface of the translucent member.

(19) The method for manufacturing the solid-state imaging apparatus according to (18), wherein the protruded portions are formed on the upper surface of the translucent member by processing the upper surface of the translucent member by etching.

(20) An electronic device including: a substrate that includes a photoelectric conversion portion; a first lens that is disposed on the substrate; a translucent member that is disposed on the lens; and a second lens that is disposed above the translucent member so as to be separated from the translucent member, wherein the translucent member includes a plurality of protruded portions that are disposed in a two-dimensional array form on an upper surface of the translucent member.

REFERENCE SIGNS LIST

1 Pixel
2 Pixel array region
3 Control circuit
4 Vertical drive circuit
5 Column signal processing circuit
6 Horizontal drive circuit
7 Output circuit
8 Vertical signal line
9 Horizontal signal line
10 Logic circuit
11 Substrate
12 Photoelectric conversion portion
13 p-type semiconductor region
14 n-type semiconductor region
15 p-type semiconductor region
16 Pixel isolation layer
17 p-well layer
18 Floating diffusion portion
21 Support substrate
22 Wiring layer
23 Wiring layer
24 Wiring layer
25 Interlayer insulation film
26 Gate electrode
27 Gate insulation film
31 Groove
32 Element isolation portion
33 Fixed charge film
34 Insulation film
35 Shielding film
36 Color filter
37 On-chip lens
41 Flattening film
42 Cover film
43 Glass seal resin
44 Glass cover
44' Translucent cover
44a Main unit portion
44a' Main unit portion
44b Protruded portion
44b' Protruded portion
45 Lower portion
46 Upper portion
47 Lower portion
48 Upper portion
49 Recessed portion
51 Insulation film
52 Wiring layer
52a Via
53 Metal pad
54 Solder mask
55 Solder ball
61 Chip region
61' Chip
61a Effective pixel region

26

61b Outer peripheral region
62 Dicing region
62a Dicing line
62b Dicing line
63 Mounting substrate
64 Imaging lens assembly
64a Imaging lens
64b Imaging lens
64c Imaging lens
64d Imaging lens
64e Imaging lens
71 Photoresist layer
71a Resist portion
72 Photomask
72a Shielding portion

The invention claimed is:
1. A solid-state imaging apparatus, comprising:
a substrate that includes a photoelectric conversion portion;
a lens that is disposed on the substrate; and
a translucent member that is disposed on the lens, wherein the translucent member includes a plurality of protruded portions that are disposed in a two-dimensional array form on an upper surface of the translucent member, wherein
the protruded portions are disposed so that:
97% or more of transmitted light, of the light which entered the upper surface of the translucent member from a subject side at a 0° incident angle, becomes a non-diffracted light, and
30% or more of transmitted light, of the light which entered the upper surface of the translucent member from a substrate side at a 43° incident angle, becomes a non-diffracted light.
2. The solid-state imaging apparatus according to claim 1, wherein
a height of the protruded portions is 0.13 to 1.00 μm.
3. The solid-state imaging apparatus according to claim 1, wherein a pitch of the protruded portions is 0.23 to 0.70 μm.
4. The solid-state imaging apparatus according to claim 1, wherein a packaging ratio of the protruded portions on the upper surface of the translucent member is 35% or more.
5. The solid-state imaging apparatus according to claim 4, wherein the packaging ratio of the protruded portions on the upper surface of the translucent member is 60% or more.
6. The solid-state imaging apparatus according to claim 1, wherein a shape of the protruded portion is a cylinder, a prism, a cone or a pyramid.
7. The solid-state imaging apparatus according to claim 1, wherein the protruded portions include a first portion, and a second portion that is disposed on the first portion and has a projection area smaller than the first portion.
8. The solid-state imaging apparatus according to claim 1, wherein a shape of a vertical cross-section of the protruded portions is a trapezoid.
9. The solid-state imaging apparatus according to claim 1, wherein the protruded portions include a recessed portion which extends in a vertical direction inside the protruded portion.
10. The solid-state imaging apparatus according to claim 1, wherein a planar shape of the portions is a circle or a polygon.
11. The solid-state imaging apparatus according to claim 1, wherein the protruded portions are formed on the upper surface of the translucent member in a triangular lattice form.

12. The solid-state imaging apparatus according to claim 1, wherein the protruded portions are exposed to air.

13. The solid-state imaging apparatus according to claim 1, wherein the protruded portions are formed of SiO$_2$, SiN, Al$_2$O$_3$, HfO$_2$, TiO$_2$ or STO (strontium titanium oxide) (where Si is silicon, O is oxygen, N is nitrogen, Al is aluminum, Hf is hafnium and Ti is titanium).

14. The solid-state imaging apparatus according to claim 1, wherein the translucent member is a glass cover.

15. The solid-state imaging apparatus according to claim 1, wherein the translucent member is adhered to the substrate.

16. A solid-state imaging apparatus, comprising:

a substrate that includes a photoelectric conversion portion;

a lens that is disposed on the substrate; and a translucent member that is disposed on the lens, wherein the translucent member includes a plurality of protruded portions that are disposed in a two-dimensional array form on an upper surface of the translucent member, and wherein the protruded portions include a first portion, and a second portion that is disposed on the first portion and has a projection area larger than the first portion.

17. The solid-state imaging apparatus according to claim 16, wherein the protruded portions are exposed to air.

18. The solid-state imaging apparatus according to claim 16, wherein the protruded portions are formed of SiO$_2$, SiN, Al$_2$O$_3$, HfO$_2$, TiO$_2$ or STO (strontium titanium oxide) (where Si is silicon, O is oxygen, N is nitrogen, Al is aluminum, Hf is hafnium and Ti is titanium).

19. The solid-state imaging apparatus according to claim 16, wherein the protruded portions are disposed so that 97% or more of transmitted light, of the light which entered the upper surface of the translucent member from a subject side at a 0° incident angle, becomes a non-diffracted light, and 30% or more of transmitted light, of the light which entered the upper surface of the translucent member from a substrate side at a 43° incident angle, becomes a non-diffracted light.

20. An electronic device, comprising:

a substrate that includes a photoelectric conversion portion;

a first lens that is disposed on the substrate;

a translucent member that is disposed on the lens; and a second lens that is disposed above the translucent member so as to be separated from the translucent member, wherein the translucent member includes a plurality of protruded portions that are disposed in a two-dimensional array form on an upper surface of the translucent member, and wherein the protruded portions are disposed so that 97% or more of transmitted light, of the light which entered the upper surface of the translucent member from a subject side at a 0° incident angle, becomes a non-diffracted light, and 30% or more of transmitted light, of the light which entered the upper surface of the translucent member from the substrate side at a 43° incident angle, becomes a non-diffracted light.

\* \* \* \* \*